(12) United States Patent
Tokunaga et al.

(10) Patent No.: US 7,936,295 B2
(45) Date of Patent: May 3, 2011

(54) DIGITAL/ANALOG CONVERTER CIRCUIT

(75) Inventors: Yusuke Tokunaga, Hyogo (JP); Shiro Sakiyama, Kyoto (JP); Shiro Dosho, Osaka (JP); Yasuyuki Doi, Kyoto (JP); Kurumi Nakayama, Osaka (JP)

(73) Assignee: Panasonic Corporation, Osaka (JP)

( * ) Notice: Subject to any disclaimer, the term of this patent is extended or adjusted under 35 U.S.C. 154(b) by 80 days.

(21) Appl. No.: 12/376,400

(22) PCT Filed: Jun. 19, 2007

(86) PCT No.: PCT/JP2007/062315
§ 371 (c)(1),
(2), (4) Date: Feb. 4, 2009

(87) PCT Pub. No.: WO2008/056462
PCT Pub. Date: May 15, 2008

(65) Prior Publication Data
US 2010/0225518 A1    Sep. 9, 2010

(30) Foreign Application Priority Data

Nov. 7, 2006  (JP) ................................. 2006-301463

(51) Int. Cl.
*H03M 1/78*  (2006.01)
(52) U.S. Cl. ........ 341/154; 341/144; 341/145; 341/152; 345/89; 345/95; 345/96; 345/99
(58) Field of Classification Search .......... 341/144–154; 345/89, 95, 98, 99
See application file for complete search history.

(56) References Cited

U.S. PATENT DOCUMENTS

| 5,477,234 | A  | * | 12/1995 | Suzuki et al. ................... 345/95 |
| 5,963,044 | A  | * | 10/1999 | Schafer ......................... 324/713 |
| 6,137,432 | A  | * | 10/2000 | Xiao ............................. 341/169 |
| 6,384,806 | B1 | * | 5/2002  | Matsueda et al. ............... 345/89 |
| 6,433,768 | B1 | * | 8/2002  | Miyazawa et al. .............. 345/98 |
| 6,486,814 | B2 |   | 11/2002 | Koyanagi |
| 6,545,624 | B2 | * | 4/2003  | Lee et al. ....................... 341/155 |
| 6,556,162 | B2 | * | 4/2003  | Brownlow et al. ............. 341/145 |
| 7,675,497 | B2 | * | 3/2010  | Park ............................... 345/89 |

(Continued)

FOREIGN PATENT DOCUMENTS

| CN | 1158770 C  | 7/2004 |
| JP | 05-035218  | 2/1993 |
| JP | 3235121    | 12/2001 |

OTHER PUBLICATIONS

Chinese Office Action, w/ English translation thereof, issued in Chinese Patent Application No. CN 200780022597.8 dated Jun. 9, 2010.

*Primary Examiner* — Linh V Nguyen
(74) *Attorney, Agent, or Firm* — McDermott Will & Emery LLP

(57) ABSTRACT

A selection section (105) selects a step voltage, among a plurality of step voltages (SV1, SV2, SV3, . . . ) each having a voltage value changing stepwise, corresponding to the digital value of digital data (D-DATA). For each of the plurality of step voltages (SV1, SV2, SV3, . . . ), different digital values are allocated to different steps of the step voltage. An amplifier section (106) amplifies the step voltage selected by the selection section (105). An output section (107) outputs the step voltage amplified by the amplifier section (106) as an output voltage (Vout) for a time period corresponding to the digital value of the digital data (D-DATA).

23 Claims, 18 Drawing Sheets

U.S. PATENT DOCUMENTS

2006/0125673 A1* 6/2006 Lee .............................. 341/155
2006/0176200 A1 8/2006 Lin et al.
2007/0194965 A1* 8/2007 Kim et al. ..................... 341/144
2009/0051676 A1* 2/2009 Cho et al. ..................... 345/211

* cited by examiner

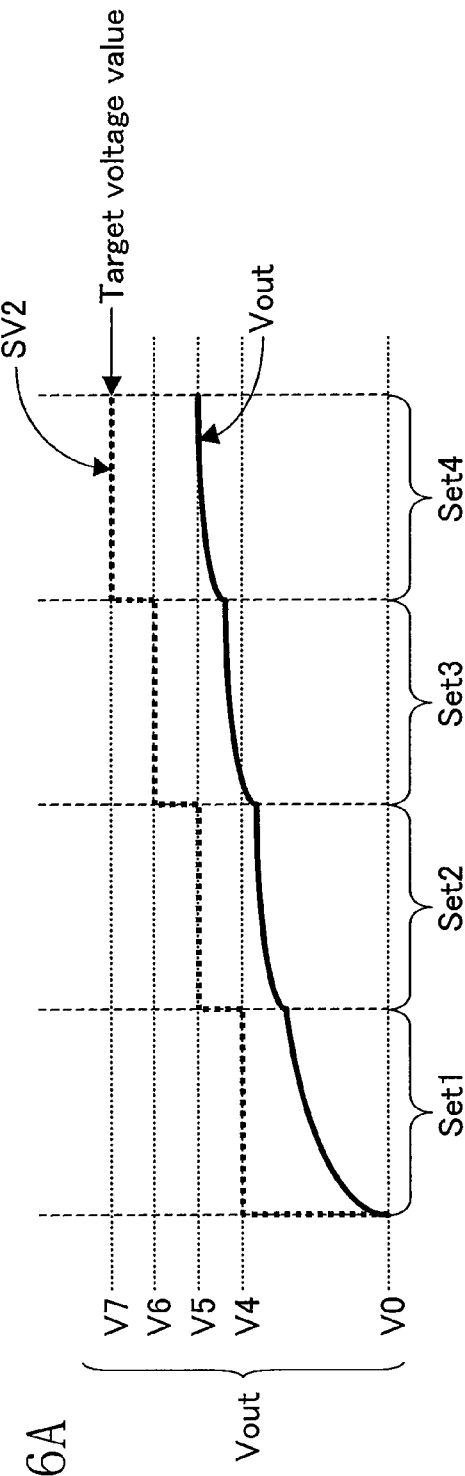
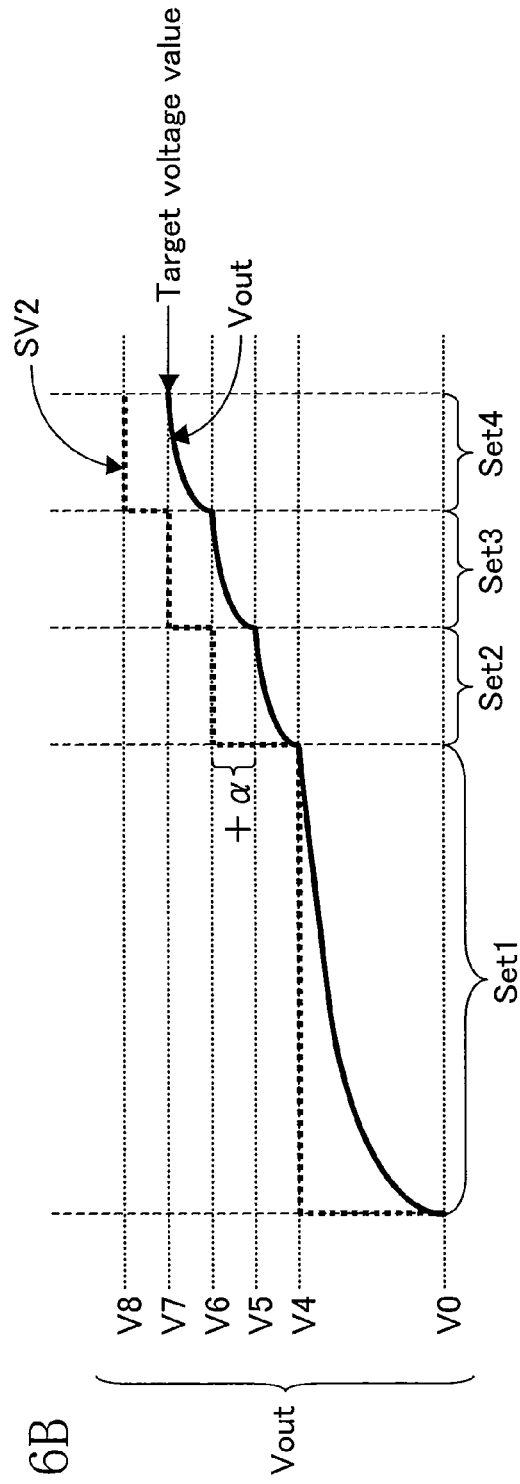
FIG. 6A
FIG. 6B

FIG. 13A

| Digital value | Voltage value of output voltage |
|---|---|
| 0 | 0.00 |
| 1 | 0.63 |
| 2 | 1.50 |
| 3 | 2.45 |
| 4 | 2.53 |
| 5 | 4.09 |
| 6 | 5.30 |
| 7 | 6.37 |
| 8 | 5.06 |
| 9 | 7.55 |
| 10 | 9.10 |
| 11 | 10.30 |
| 12 | 7.59 |
| 13 | 11.01 |
| 14 | 12.90 |
| 15 | 14.23 |
| 16 | 10.11 |
| 17 | 14.47 |
| 18 | 16.70 |
| 19 | 18.15 |
| 20 | 12.64 |

FIG. 13B

| Voltage value of output voltage | Corrected digital value |
|---|---|
| 0.00 | 0 |
| 0.63 | 1 |
| 1.50 | 2 |
| 2.45 | 3 |
| 2.53 | 4 |
| 4.09 | 5 |
| 5.06 | 8 |
| 5.30 | 6 |
| 6.37 | 7 |
| 7.55 | 9 |
| 7.59 | 12 |
| 9.10 | 10 |
| 10.11 | 16 |
| 10.30 | 11 |
| 11.01 | 13 |
| 12.64 | 20 |
| 12.90 | 14 |
| 14.23 | 15 |
| 14.47 | 17 |
| 16.70 | 18 |
| 18.15 | 19 |

FIG. 13C

| Digital value | Corrected digital value |
|---|---|
| 0 | 0 |
| 1 | 1 |
| 2 | 2 |
| 3 | 3 |
| 4 | 4 |
| 5 | 5 |
| 6 | 8 |
| 7 | 6 |
| 8 | 7 |
| 9 | 9 |
| 10 | 12 |
| 11 | 10 |
| 12 | 16 |
| 13 | 11 |
| 14 | 13 |
| 15 | 20 |
| 16 | 14 |
| 17 | 15 |
| 18 | 17 |
| 19 | 18 |
| 20 | 19 |

DIGITAL/ANALOG CONVERTER CIRCUIT

RELATED APPLICATIONS

This application is the U.S. National Phase under 35 U.S.C. §371 of International Application No. PCT/JP2007/062315, filed on Jun. 19, 2007, which in turn claims the benefit of Japanese Application No. 2006-301463, filed on Nov. 7, 2006, the disclosures of which Applications are incorporated by reference herein.

TECHNICAL FIELD

The present invention relates to a circuit for supplying an output voltage having a voltage value corresponding to the digital value of digital data, and more particularly to a digital/analog converter circuit in a drive device for driving a liquid crystal panel and the like having a load capacitance.

BACKGROUND ART

The mainstream of conventional digital/analog converter circuits has been a type in which a reference voltage generation circuit using a resistance divider circuit generates a plurality of reference voltages corresponding to the bit precision of digital data, a selector selects a reference voltage, among the plurality of reference voltages, corresponding to the digital value of digital data, and the selected reference voltage is supplied to a buffer. In this type, however, with enhancement of the bit precision, the circuit scale of the selector increases exponentially. It is therefore difficult to reduce the circuit area of a high-definition driver. In particular, a liquid crystal driver, which is required to achieve reduction in circuit area as well as high definition and high gradation, has found difficulty in implementing these requirements simultaneously.

To overcome the above problem, Japanese Laid-Open Patent Publication No. 3235121 (Patent Document 1) gives the bit resolution along, not only the voltage axis, but also the time axis to reduce the circuit scale of the selector. To state more specifically, a step voltage whose value changes step-wise is supplied to each of a plurality of reference voltage lines, a sampling switch circuit selects a step voltage, among the plurality of step voltages supplied to the plurality of reference voltage lines, corresponding to the digital value of the most significant bits of digital data, the selected step voltage is accumulated in a hold capacitor, and the accumulated voltage is amplified with an output amplifier and outputted.

Patent Document 1: Japanese Laid-Open Patent Publication No. 3235121

DISCLOSURE OF THE INVENTION

Problems to be Solved by the Invention

However, since the sample/hold circuit composed of the switch (sampling switch circuit) and the capacitor (hold capacitor) is placed upstream of the buffer, the capacitor constituting the sample/hold circuit must have a sufficiently large capacitance value (normally, several pF) for suppression of switch field through noise. Hence, the time constant in the signal path from a reference voltage generation circuit to the output buffer increases by the sample/hold circuit. This delays the response of the output voltage, possibly producing a difference between the voltage value (target voltage value) corresponding to the digital value and the voltage value of the actually outputted voltage (settling error).

The time constant in the signal path from the reference voltage generation circuit to the output buffer may be reduced by reducing the resistance value of the sample/hold circuit. In this case, however, the size of the switch will become large to reduce the ON resistance of the switch, and with increase of the switch size, the switch field through noise may increase. To suppress increase of the switch field through noise, the capacitor must have a large capacitance value. This will not only increase the circuit scale but also increase the time constant. Hence, the originally intended effect of reducing the time constant will be small. As another means for reducing the time constant in the signal path from the reference voltage generation circuit to the output buffer, considered is reducing the resistance value of a resistance divider circuit (ladder resistance) for generating reference voltages as the sources of step voltages. This will however result in increase of the through current in the resistance divider circuit causing increase of the power consumption. Hence, the conventional configurations find difficulty in reducing the time constant in the signal path from the reference voltage generation circuit to the output buffer to reduce the settling error.

With the progress toward higher definition and higher gradation, the settling time for the output voltage become shorter. The voltage value of the output voltage therefore fails to reach the target voltage value corresponding to the digital value, causing a settling error. If the settling error becomes excessively large, the linear relationship between the digital value and the voltage value of the output voltage is broken, failing to secure the monotonous increase characteristic of the output voltage.

An object of the present invention is providing a digital/analog converter circuit small in settling error. More specifically, an object of the present invention is reducing the settling error by reducing the time constant in the signal path from the reference voltage generation circuit to the output buffer and/or enhancing the change rate of the output voltage.

Means for Solving the Problems

According to one aspect of the invention, the digital/analog converter circuit generates an output voltage having a voltage value corresponding to a digital value of digital data and supplies the output voltage to a load capacitance as an object to be driven. The digital/analog converter circuit includes: a selection section for selecting a step voltage, among a plurality of step voltages each having a voltage value changing stepwise, corresponding to the digital value of the digital data; an amplifier section for amplifying the step voltage selected by the selection section; and an output section for supplying the step voltage amplified by the amplifier section as the output voltage for a time period corresponding the digital value of the digital data. For each of the plurality of step voltages, different digital values are allocated to different steps of the step voltage.

In the digital/analog converter circuit described above, no sample/hold circuit composed of a switch and a capacitor is provided between the selection section and the amplifier section, but a sample/hold circuit is composed of the output section connected downstream of the amplifier section and the load capacitance as the object to be driven. Hence, the time constant in the signal path from the step voltage supply source to the amplifier section can be widely reduced. This can reduce the circuit scale and also speed up the response of the output voltage, which results in reduction in settling error. Also, when the object to be driven is a liquid crystal panel, the load capacitance is normally as large as several tens of pF that is enough to neglect the influence of switch field through noise. In this case, therefore, the resistance value at the output section can be sufficiently reduced, and thus the time constant from the output section to the load capacitance can be reduced.

Alternatively, the digital/analog converter circuit includes: a selection section for selecting a step voltage, among a plurality of step voltages each having a voltage value changing stepwise, corresponding to the digital value of the digital data; and an output section for outputting the step voltage selected by the selection section for a time period corresponding to the digital value of the digital data. For each of the plurality of step voltages, different digital values are allocated to different steps of the step voltage, and a settling time for the first step of the step voltage is longer than a settling time for each of the second and subsequent steps of the step voltage. The output section may include: a voltage hold portion for holding the step voltage selected by the selection section; and an amplifier portion for amplifying the voltage held by the voltage hold portion and outputting the amplified voltage as the output voltage, for example.

In the digital/analog converter circuit described above, the voltage value of the output voltage is allowed to reach the voltage value for the first step of the step voltage within the settling time for the first step. Hence, the settling error can be reduced, and thus the monotonous increase characteristic of the output voltage can be secured.

Alternatively, the digital/analog converter circuit includes: a selection section for selecting a step voltage, among a plurality of step voltages each having a voltage value changing stepwise, corresponding to the digital value of the digital data; and an output section for outputting the step voltage selected by the selection section for a time period corresponding to the digital value of the digital data. For each of the plurality of step voltages, different digital values are allocated to different steps of the step voltage, and a voltage value for the first step of the step voltage is higher than a target voltage value corresponding to a digital value allocated to the first step. The output section may include: a voltage hold portion for holding the step voltage selected by the selection section; and an amplifier portion for amplifying the voltage held by the voltage hold portion and outputting the amplified voltage as the output voltage, for example.

In the digital/analog converter circuit described above, the change rate of the voltage value of the output voltage can be increased in the settling time for the first step of the step voltage. Hence, the voltage value of the output voltage is allowed to reach the target voltage value corresponding to the first step of the step voltage within the settling time for the first step, and thus the monotonous increase characteristic of output voltage can be secured.

Preferably, for each of the plurality of step voltages, voltage values for the second and subsequent steps of the step voltage are higher than target voltage values corresponding to digital values allocated to these steps.

In the digital/analog converter circuit described above, the change rate of the voltage value of the output voltage can be increased in the settling time for each of the second and subsequent steps of the step voltage. Hence, the voltage value of the output voltage is allowed to reach the target voltage values corresponding to the second and subsequent steps of the step voltage within the settling times for these steps, and thus the linearity between the digital value and the voltage value of the output voltage can be further improved.

Preferably, the digital/analog converter circuit described above further includes a settling time adjustment section for adjusting, for each of the plurality of the step voltages, the settling time for the first step of the step voltage according to the magnitude of a time constant of the output voltage.

In the digital/analog converter circuit described above, the increase in settling error in the first step of the step voltage can be suppressed, and thus the monotonous increase characteristic of the output voltage can be further secured.

Preferably, the digital/analog converter circuit described above further includes an emphasis adjustment section for adjusting, for each of the plurality of the step voltages, the voltage value for the first step of the step voltage according to the magnitude of a time constant of the output voltage.

In the digital/analog converter circuit described above, the increase in settling error in the first step of the step voltage can be suppressed, and thus the monotonous increase characteristic of the output voltage can be further secured.

Preferably, the digital/analog converter circuit described above further includes an emphasis adjustment section for adjusting, for each of the plurality of the step voltages, the voltage values for the second and subsequent steps of the step voltage according to the magnitude of a time constant of the output voltage.

In the digital/analog converter circuit described above, in which the emphasis amount for each of the second and subsequent steps of the step voltage is adjusted according to the change in the magnitude of the time constant of the output voltage, the improvement in the linearity between the digital value and the voltage value of the output voltage can be maintained.

Alternatively, the digital/analog converter circuit includes: a conversion section for converting the digital value of the digital data to a corrected digital value whose correspondence with the voltage value of an actual output voltage is linear; a selection section for selecting a step voltage, among a plurality of step voltages, corresponding to the corrected digital value of the digital data obtained by the conversion section; and an output section for outputting the step voltage selected by the selection section as the output voltage for a time period corresponding to the corrected digital value of the digital data obtained by the conversion section. The output section includes: a voltage hold portion for holding the step voltage selected by the selection section; and an amplifier portion for amplifying the voltage held by the voltage hold portion and outputting the amplified voltage as the output voltage, for example.

In the digital/analog converter circuit described above, in which the relationship between the digital value and the voltage value of the output voltage is linear, the monotonous increase characteristic of the output voltage can be secured.

Effect of the Invention

As described above, the difference between the target voltage value corresponding to the digital value and the voltage value of the output voltage (settling error) can be reduced.

BRIEF DESCRIPTION OF THE DRAWINGS

FIG. 6A is a waveform diagram for explaining the output voltage for comparison. FIG. 6B is a waveform diagram for explaining changes in output voltage in Embodiment 2 of the present invention.

FIG. 13A is a view showing the correspondence between the digital value and the voltage value of the output voltage. FIG. 13B is a view showing the correspondence between the voltage value of the output voltage and the corrected digital value. FIG. 13C is a view showing an example of a lookup table.

DESCRIPTION OF THE REFERENCE NUMERALS

Figure 1:
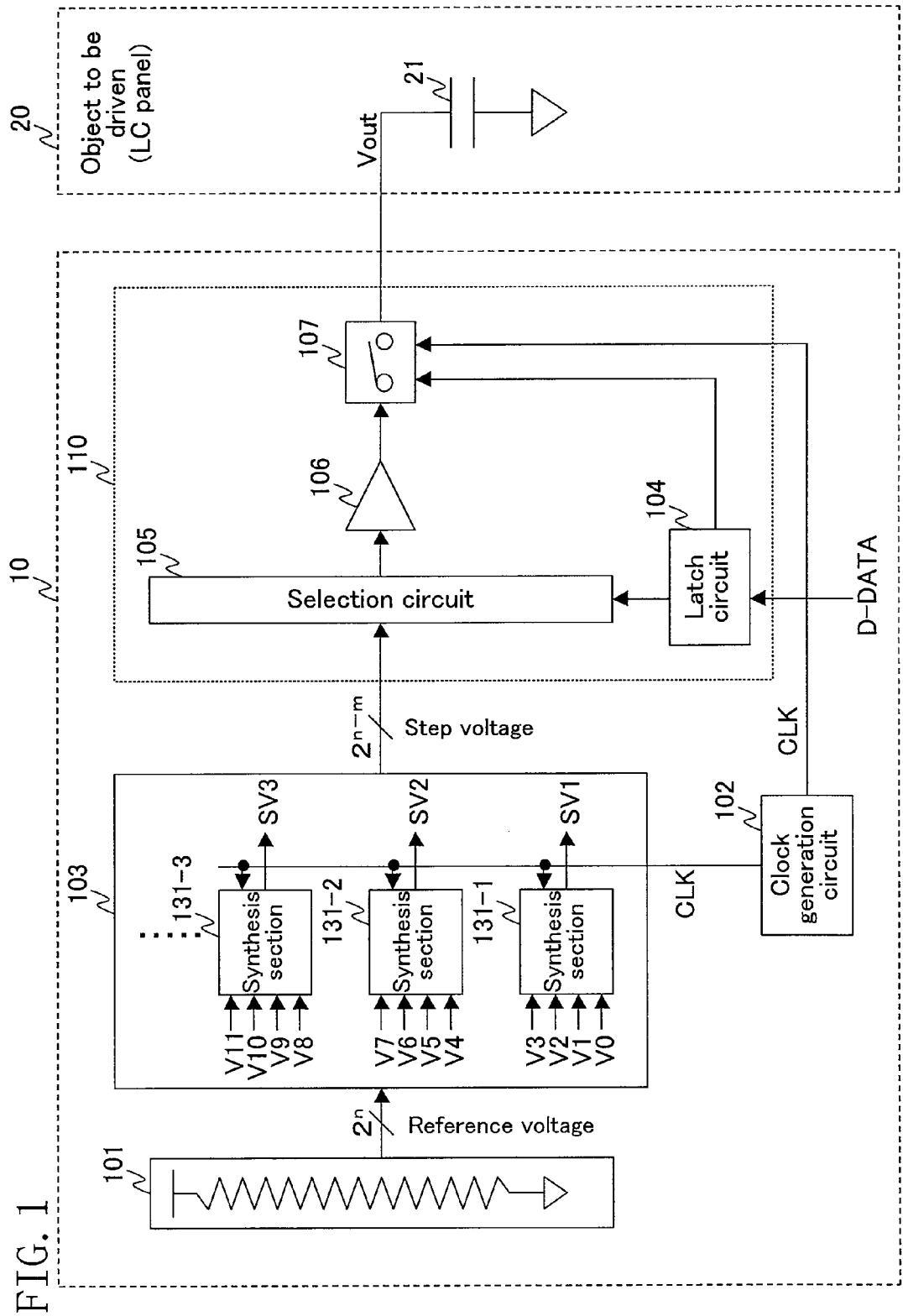
FIG. 1 is a block diagram of a drive device of Embodiment 1 of the present invention.

10 Drive device
101, 401 Reference voltage generation circuit
102, 302 Clock generation circuit
103, 303 Step voltage generation circuit
104 Latch circuit
105 Selection circuit
106 Buffer
107 Switch
110 Digital/analog converter circuit (DAC circuit)
20 Object to be driven (LC panel)
21 Load capacitance
131-1, 131-2, 131-3 Synthesis section
30 Liquid crystal panel
G1, G2, G3 Gate line
S1, S2, S3, S4 Source line
331 Switch circuit
501 Converter circuit
111 Capacitor

BEST MODE FOR CARRYING OUT THE INVENTION

Hereinafter, embodiments of the present invention will be described in detail with reference to the accompanying drawings. Note that in the drawings the same or equivalent components are denoted by the same reference numerals and description thereof will not be repeated.

Embodiment 1

FIG. 1 shows a configuration of a drive device of Embodiment 1 of the present invention. The drive device 10 includes a reference voltage generation circuit 101, a clock generation circuit 102, a step voltage generation circuit 103 and a digital/analog converter (DAC) circuit 110 including a latch circuit 104, a selection circuit 105, a buffer 106 and a switch 107. The drive device 10 supplies an output voltage having a voltage value corresponding to the gradient (digital value) indicated in gradation data of n-bit precision (n is a natural number). The drive device 10 also selects a step voltage, among a plurality of step voltages each having a voltage value changing stepwise, corresponding to the gradation data, and outputs the selected step voltage for the time period corresponding to the gradation data. In other words, the drive device 10 gives the bit resolution along, not only the voltage axis, but also the time axis.

The reference voltage generation circuit 101, composed of a ladder resistance, for example, generates a plurality of reference voltages corresponding to the bit precision of gradation data D-DATA. In other words, the reference voltage generation circuit 101 generates $2^n$ reference voltages having $2^n$ voltage values (target voltage values) corresponding one-to-one to $2^n$ digital values.

The clock generation circuit 102 generates a clock signal CLK for controlling generation of step voltages and the output time periods for the step voltages. Herein, the clock signal CLK includes, within one horizontal period, a reference pulse for determining the start timing of a step voltage and $2^m$ (m is a natural number; m<n) additional pulses for determining timing at which the voltage value of the step voltage changes.

The step voltage generation circuit 103 generates $2^{n-m}$ step voltages each having a voltage value changing in $2^m$ steps in synchronization with the clock signal CLK from the clock generation circuit 102. More specifically, each of $2^{n-m}$ synthesis sections 131-1, 131-2, 131-3, . . . of the step voltage generation circuit 103 receives $2^m$ reference voltages among the $2^n$ reference voltages and sequentially selects the $2^m$ reference voltages in ascending order of the voltage value in synchronization with the clock signal CLK.

The latch circuit 104 receives n-bit gradation data D-DATA, and outputs the digital value of the (n−m) most significant bits of the gradation data D-DATA to the selection circuit 105 and the digital value of m least significant bits thereof to the switch 107.

The selection circuit 105 selects a step voltage, among the $2^{n-m}$ step voltages generated by the step voltage generation circuit 103, corresponding to the digital value of the (n−m) most significant bits of the gradation data D-DATA.

The buffer 106 amplifies the step voltage selected by the selection circuit 105 and outputs the amplified step voltage.

The switch 107 outputs the step voltage amplified and outputted by the buffer 106 for the time period corresponding to the digital value of the m least significant bits of the gradation data D-DATA from the latch circuit 104. More specifically, the switch 107 outputs the step voltage for the time period from the reference pulse of the clock signal CLK to an additional pulse corresponding to the digital value of the m least significant bits of the gradation data D-DATA. In this way, an output voltage Vout having a voltage value corresponding to the digital value of the gradation data D-DATA is supplied to a load capacitance 21 of a liquid crystal panel 20.

Figure 2:
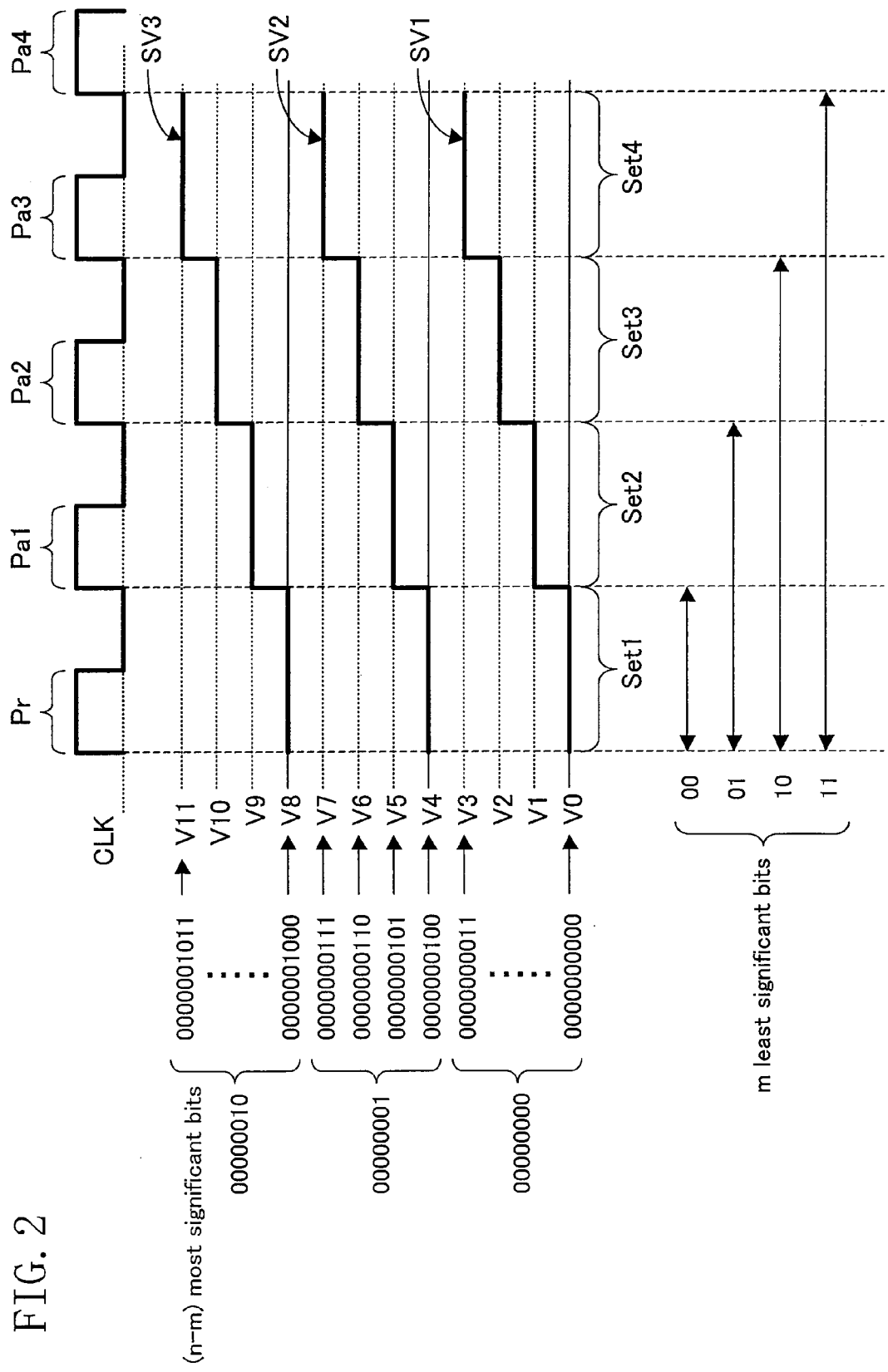
FIG. 2 is a waveform diagram for explaining step voltages in the drive device of FIG. 1.

The step voltages will be described with reference to FIG. 2. To each of the $2^{n-m}$ step voltages to be generated by the step voltage generation circuit 103, $2^m$ digital values, among $2^n$ digital values, which are identical in the value of the (n–m) most significant bits are allocated. In other words, each of the $2^{n-m}$ step voltages corresponds to (n–m) bit precision.

The smallest digital value among the $2^m$ digital values for each step voltage is allocated to the first step of the step voltage, the second smallest digital value is allocated to the second step of the step voltage, and the largest digital value is allocated to the final ($2^m$-th) step of the step voltage. In other words, in each of the $2^{n-m}$ step voltages, the voltage value increases stepwise each by one level of gradation in n-bit precision.

To generate such step voltages, in the step voltage generation circuit 103, $2^m$ digital values, among $2^n$ digital values, which are identical in the value of the (n–m) most significant bits are allocated to each of the $2^{n-m}$ synthesis sections. Each of the $2^{n-m}$ synthesis sections receives $2^m$ voltages corresponding to the $2^m$ digital values and sequentially selects the $2^m$ voltages in ascending order of the voltage value.

In this embodiment, the voltage values for the steps of each step voltage are equivalent to the target voltage values corresponding to the digital values allocated to the respective steps. In other words, in this embodiment, each of the $2^{n-m}$ synthesis sections receives $2^m$ reference voltages corresponding one-to-one to the $2^m$ digital values. Assuming herein that n=10 and m=2, four digital values each having a value of the eight most significant bits of "00000001" are allocated to step voltage SV2. The voltages for the respective steps of the step voltage SV2 are as follows.

First step: Reference voltage V4 (target voltage value corresponding to digital value "0000000100")
Second step: Reference voltage V5 (target voltage value corresponding to digital value "0000000101")
Third step: Reference voltage V6 (target voltage value corresponding to digital value "0000000110")
Fourth step: Reference voltage V7 (target voltage value corresponding to digital value "0000000111")

The output times (settling times) for the respective steps of the step voltage are determined with the pulses of the clock signal CLK. For example, the step voltage generation circuit 103 starts output of a voltage that is to be the first step of a step voltage in synchronization with the rising edge of the reference pulse of the clock signal CLK, and stops the output of the voltage for the first step of the step voltage and also starts output of a voltage that is to be the second step of the step voltage in synchronization with the rising edge of the additional pulse occurring next to the reference pulse. In this case, the settling time for the first step of the step voltage is determined with the rising edge of the reference pulse and the rising edge of the additional pulse. For example, assuming that m=2, the settling times for the steps of a step voltage can be determined as follows.

First-step settling time Set 1: Time period from reference pulse Pr to additional pulse Pa1
Second-step settling time Set 2: Time period from additional pulse Pa1 to additional pulse Pa2
Third-step settling time Set 3: Time period from additional pulse Pa2 to additional pulse Pa3
Fourth-step settling time Set 4: Time period from additional pulse Pa3 to additional pulse Pa4

In the switch 107, the output time period of a step voltage is determined in advance for each of $2^m$ digital values (m-bit digital values). For example, for the smallest digital value among the $2^m$ digital values, it is determined that "the step voltage is outputted for the time period from the rising edge of the reference pulse of the clock signal CLK to the rising edge of the next-occurring additional pulse". For example, assuming that m=2, the output time periods of a step voltage for respective digital values are determined as follows.

Digital value "00": Time period from reference pulse Pr to additional pulse Pa1
Digital value "01": Time period from reference pulse Pr to additional pulse Pa2
Digital value "10": Time period from reference pulse Pr to additional pulse Pa3
Digital value "11": Time period from reference pulse Pr to additional pulse Pa4

Figure 3:
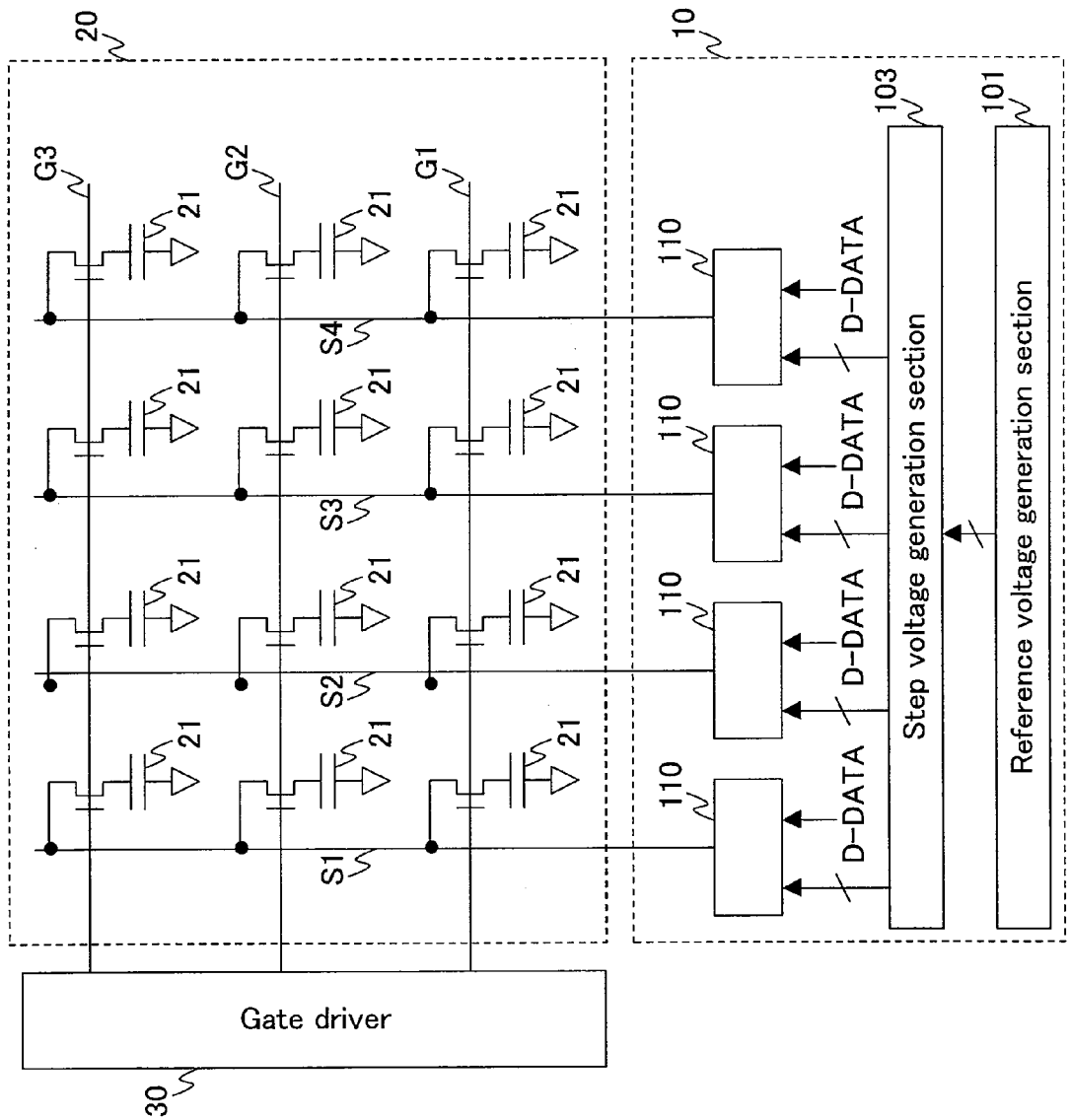
FIG. 3 is a view showing the entire configuration of a liquid crystal display device.

FIG. 3 shows the entire configuration of a liquid crystal display device. The liquid crystal display device includes a liquid crystal panel 20, a gate driver 30 and the drive device 10 shown in FIG. 1. In the liquid crystal panel 20, a plurality of liquid crystal capacitances (load capacitances) 21 are placed in a matrix, and a plurality of gate lines G1, G2, G3, . . . and a plurality of source lines S1, S2, S3, . . . are placed. The drive device 10 includes a plurality of DAC circuits 110 corresponding to the plurality of source lines S1, S2, S3, . . . . Each of the plurality of DAC circuits 110 supplies its output voltage having a voltage value corresponding to the digital value of gradation data D-DATA to the source line corresponding to the DAC circuit. The gate driver 30 sequentially selects the gates lines G1, G2, G3, . . . of the liquid crystal panel 20 to turn ON transistors connected to each selected gate line. In this way, the output voltage from each DAC circuit 110 is supplied to a liquid crystal capacitance 21 via the corresponding source line.

Figure 4:
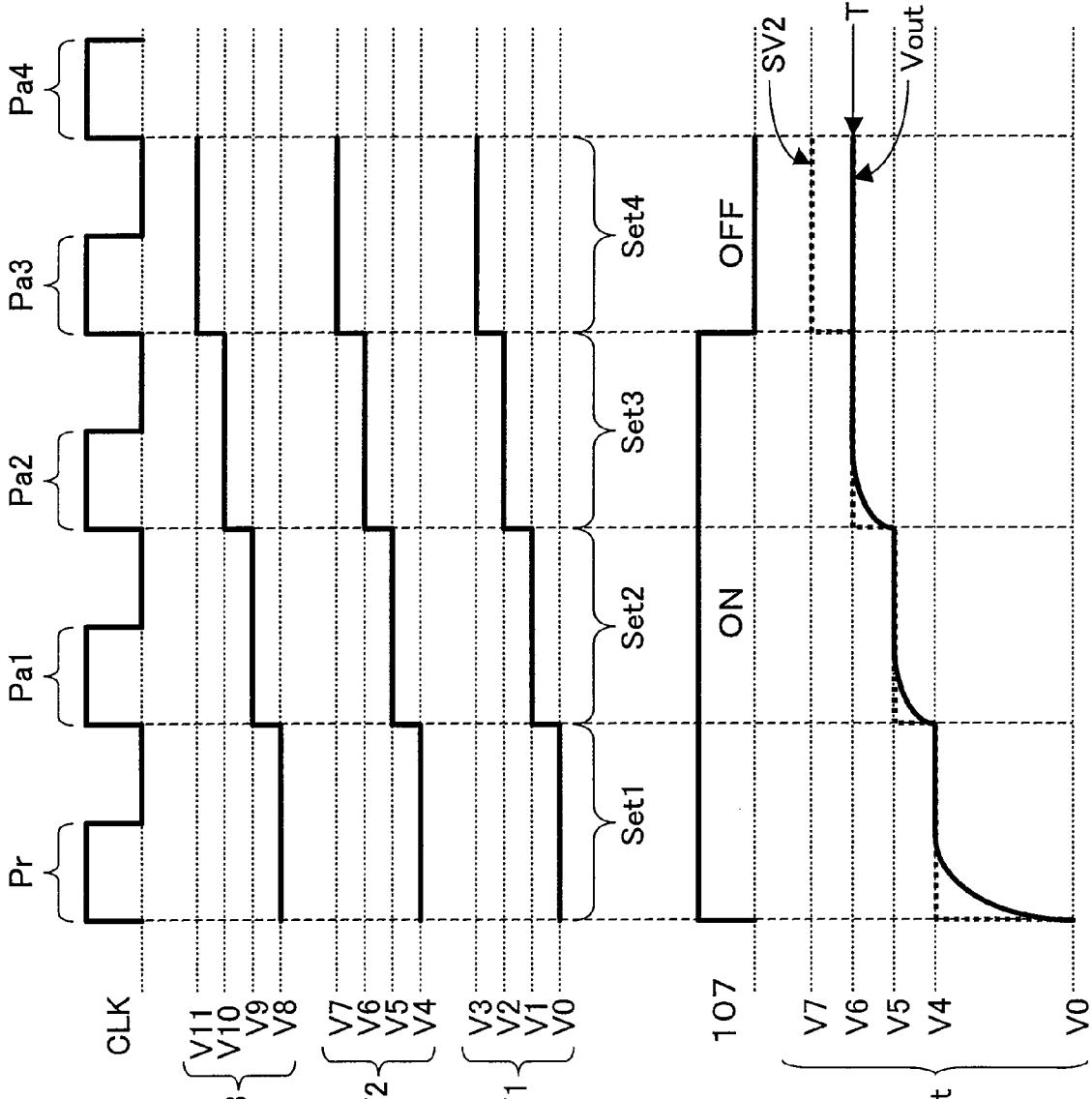
FIG. 4 is a waveform diagram for explaining the operation of the drive device of FIG. 1.

Next, the operation of the drive device of FIG. 1 will be described with reference to FIG. 4. It is herein assumed that n=10 and m=2 and that the digital value of the gradation data D-DATA given to the latch circuit 104 is "0000000110".

First, the step voltage generation circuit 103 generates $2^{10-2}$ step voltages SV1, SV2, SV3, . . . in synchronization with the clock signal CLK. Each of the step voltages SV1, SV2, SV3, . . . changes in voltage value in $2^2$ steps.

The latch circuit 40 receives the gradation data D-DATA and outputs the digital value of the eight most significant bits of the data, "00000001", to the selection circuit 105 and the value of the two least significant bits thereof, "10", to the switch 107.

The selection circuit 105 selects the step voltage SV2 corresponding to the digital value "00000001" received from the latch circuit 104. The buffer 106 amplifies the step voltage SV2 selected by the selection circuit 105.

The switch 107 outputs the step voltage SV2 received from the buffer 106 for the time period corresponding to the digital value "10" received from the latch circuit 104 (i.e., the time period from the rising edge of the reference pulse Pr to the rising edge of the additional pulse Pa3 in the clock signal CLK). Hence, the voltage value of the output voltage Vout rises up to the voltage value V4 within the settling time Set1, up to the voltage value V5 within the settling time Set2 and up to the voltage value V6 within the settling time Set3. Once the rising edge of the additional pulse Pa3 occurs in the clock signal CLK, the switch 107 stops the output of the step voltage SV2. In this way, the voltage value of the output voltage Vout is finally equal to the voltage value of the reference voltage V6. In other words, the output voltage Vout having the target voltage value (voltage value of the reference voltage V6) corresponding to the digital value "0000000110" is supplied to the load capacitance 21 of the liquid crystal panel.

With the above configuration, in which it is unnecessary to provide a sample/hold circuit between the selection circuit 105 and the buffer 106, the time constant in the signal path from the reference voltage generation circuit 101 to the buffer 106 can be reduced. Hence, the time constant in the signal path from the reference voltage generation circuit 101 to the load capacitance 21 can be widely reduced. This permits speedup of the response of the output voltage as well as reduction in circuit scale. The settling error can therefore be reduced.

Also, since the load capacitance 21 of the liquid crystal panel is normally as large as several tens of pF, the influence of switch field through noise due to the switch 107 can be neglected. The size of the switch 107 can therefore be increased to reduce the ON resistance, and hence the time constant in the signal path from the buffer 106 to the load capacitance 21 can be reduced.

Moreover, it is unnecessary to reduce the resistance value of the reference voltage generation circuit for reducing the time constant in the signal path from the reference voltage generation circuit 101 to the load capacitance 21 (the time constant of the output voltage). Hence, no concern for increase in power consumption is necessary.

Embodiment 2

A drive device of Embodiment 2 of the present invention is substantially the same in configuration as the drive device of FIG. 1 but is different therefrom in the processing by the clock generation circuit 102 and the step voltage generation circuit 103.

The clock generation circuit 102 generates a clock signal CLK' in which the time period equivalent to the settling time for the first step of a step voltage (time period determined with the reference pulse and the first additional pulse) is longer than each of the ($2^m-1$) time periods equivalent to the settling times for the ($2^m-1$) steps of the step voltage (each of the ($2^m-1$) time periods determined with the $2^m$ additional pulses).

In synchronization with the clock signal, the step voltage generation circuit 103 generates $2^{n-m}$ step voltages in which the first settling time is longer than each of the second and subsequent settling times. Also, while the voltage value for the first step of a step voltage is equivalent to the target voltage value corresponding to the digital value allocated to the first step, the voltage values for the second and subsequent steps of the step voltage are equivalent to voltage values obtained by adding an emphasis amount α to the target voltage values corresponding to the digital values allocated to the respective steps.

Figure 5:
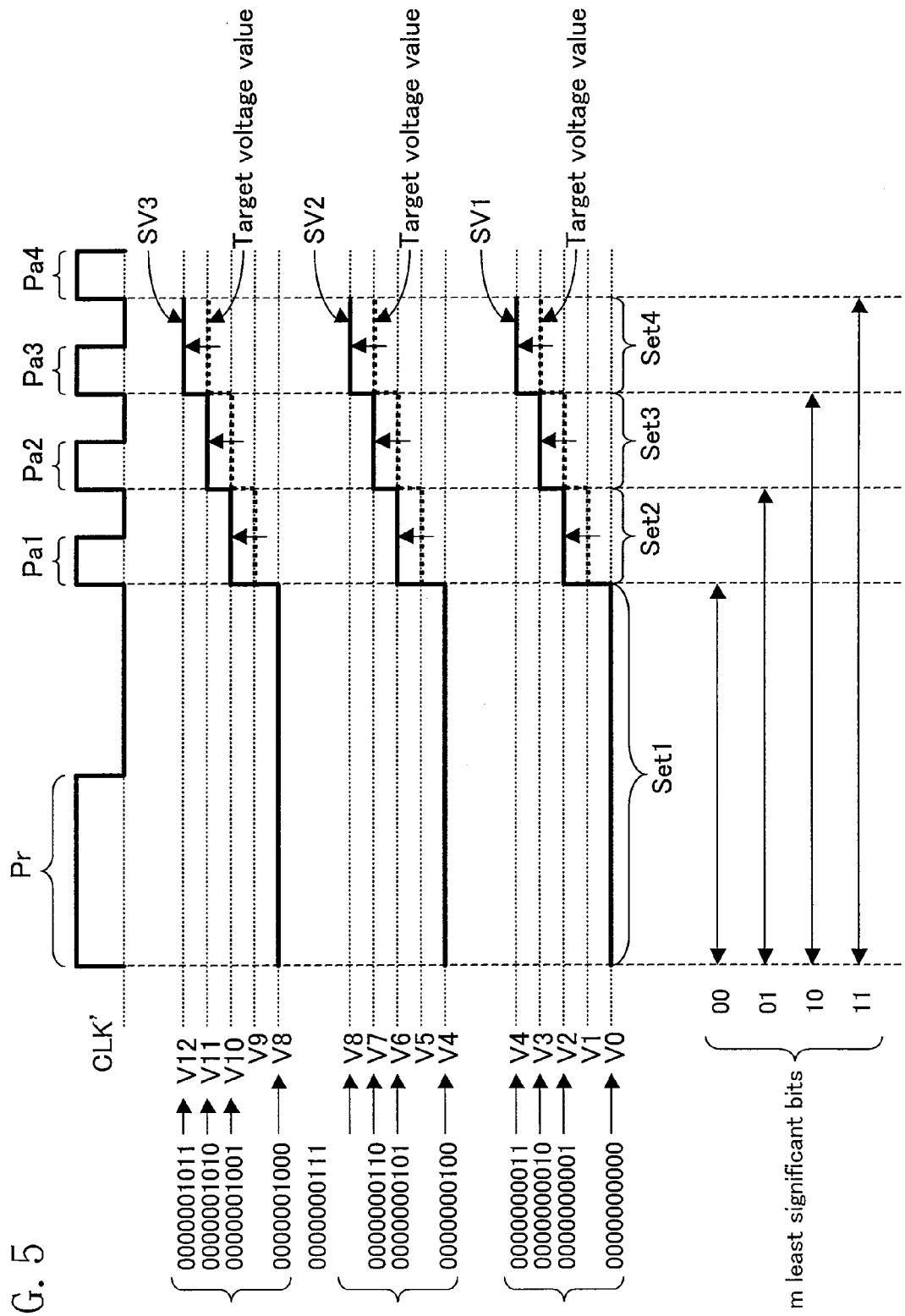
FIG. 5 is a waveform diagram for explaining step voltages in a drive device of Embodiment 2 of the present invention.

Referring to FIG. 5, the step voltages in this embodiment will be described. In this embodiment, the voltage value for the first step of a step voltage is the target voltage value corresponding to the digital value allocated to the first step. The voltage values for the second and subsequent steps of the step voltage are voltage values obtained by adding an "emphasis amount α" to the "target voltage values corresponding to the digital values allocated to the respective steps".

To generate such step voltages, each of the $2^{n-m}$ synthesis sections of the step voltage generation circuit 103 receives a voltage indicating the target voltage value corresponding to the first step of the step voltage (i.e., the reference voltage) and also receives ($2^m-1$) voltages corresponding to the ($2^m-1$) steps other than the first step. The voltage values of the ($2^m-1$) voltages are equivalent to voltage values obtained by adding the emphasis amount a to the respective target voltage values.

Assuming that n=10 and m=2, four digital values each having a value of the eight most significant bits of "00000001" are allocated to step voltage SV2. When "emphasis amount α"="voltage value of one level of gradation", the voltage values for the respective steps of the step voltage SV2 are as follows:

First step: Reference voltage V4 (target voltage value corresponding to digital value "0000000100")

Second step: Reference voltage V6 (target voltage value (V5) corresponding to digital value "0000000101"+emphasis amount α)

Third step: Reference voltage V7 (target voltage value (V6) corresponding to digital value "0000000110"+emphasis amount α)

Fourth step: Reference voltage V8 (target voltage value (V7) corresponding to digital value "0000000111"+emphasis amount α)

The control of the settling time for each step of the step voltage and the output time period of the step voltage is executed following substantially the same procedure as that in Embodiment 1. In this embodiment, however, the time period equivalent to the settling time for the first step of the step voltage in the clock signal CLK is extended. The settling time Sell is therefore longer than that in FIG. 2 and the settling times Set2, Set3 and Set4 are shorter than those in FIG. 2. Also, the output time periods of the step voltage corresponding to the m least significant bits are longer than those in FIG. 2.

Next, the operation of the drive device of this embodiment will be described with reference to FIGS. 6A and 6B. Note that the description will be made taking the case of output of the step voltage SV2 as an example.

As the time constant of the output voltage Vout is greater, the rise rate of the voltage value of the output voltage Vout is slower. Hence, the time required for the output voltage Vout to reach the voltage value for each step of the step voltage is longer. When the settling times Set1, Set2, Set3 and Set4 for the steps of the step voltage are equal to one another as in FIG. 6A, the voltage value may possibly shift from the first step to the second step in the step voltage SV2 before the output voltage Vout reaches the voltage value for the first step of the step voltage SV2, causing a settling error in the first step of the step voltage.

When the settling time Set1 for the first step of the step voltage is longer than the other settling times Set2, Set3 and Set4 as in FIG. 6B, the output voltage Vout can reach the voltage value for the first step of the step voltage SV2 within the settling time Set1. Hence, the settling error in the first step of the step voltage can be reduced. Moreover, since the voltage values for the second and subsequent steps of the step voltage are higher than the respective target voltage values, the rise rate of the output voltage Vout can be increased. Hence, the settling error in these steps of the step voltage can be reduced.

Figure 7:
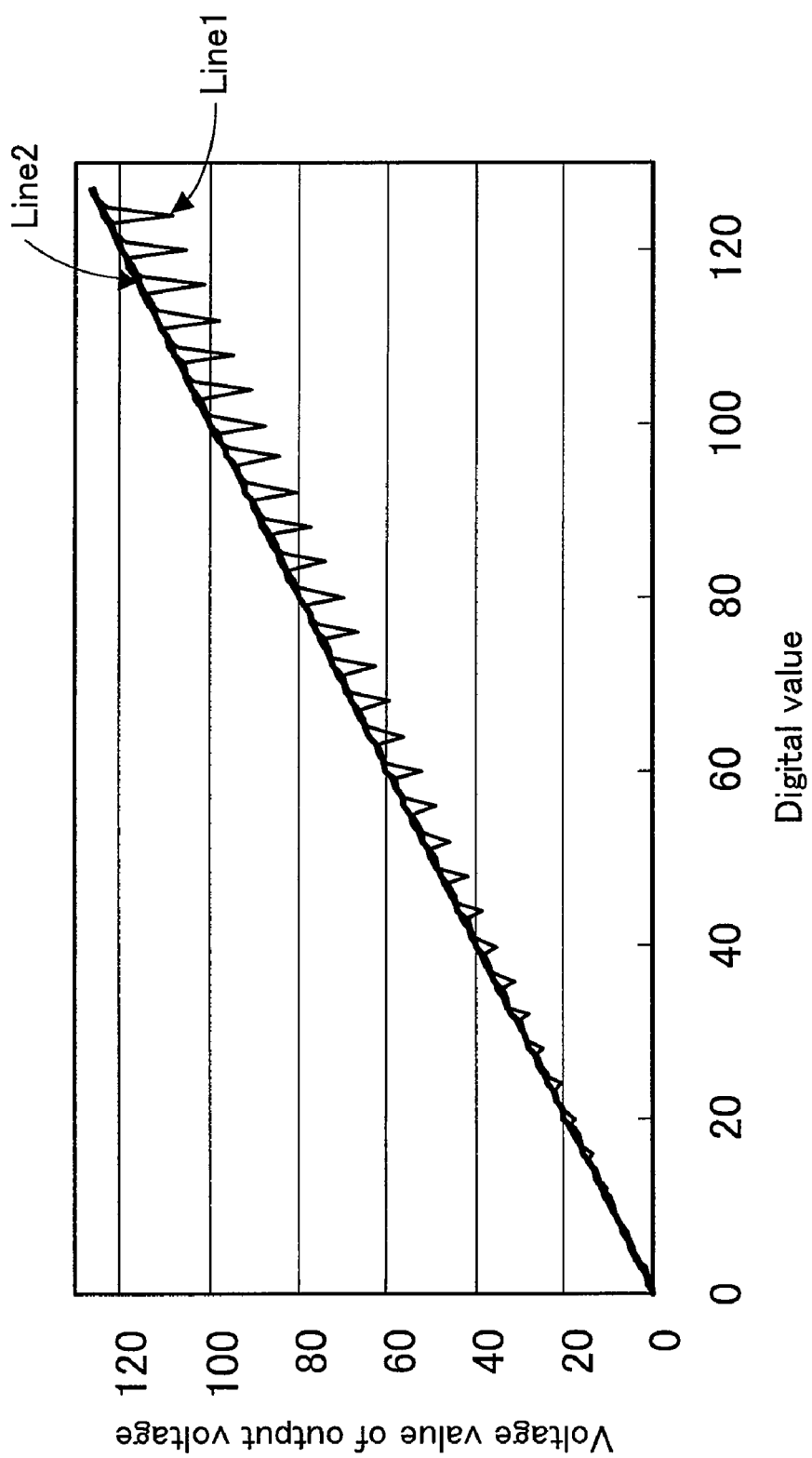
FIG. 7 is a graph for explaining the relationship between the digital value and the output value of the output voltage in Embodiment 2 of the present invention.

Hereinafter, the relationship between the digital value and the voltage value of the output voltage will be described with reference to FIG. 7. In the case of FIG. 6A, if the settling error in the first stage of the step voltage is great, the linear relationship between the digital value and the voltage value of the output voltage will be broken ("repeat code" phenomenon). Instead, the relationship between the digital value and the voltage value of the output voltage will be like line Line1.

In the case of FIG. 6B, in which the settling error in the first step of the step voltage can be reduced, the (n–m) bit precision that is coarser than n-bit precision can be improved, and thus the monotonous increase characteristic of the output voltage can be ensured. Moreover, in each of the second and subsequent steps of the step voltage, since the rise rate of the output voltage Vout can be increased, the output voltage Vout is allowed to reach the target voltage value even though the settling time is short. Hence, the relationship between the digital value and the voltage value of the output voltage is linear like Line 2, preventing occurrence of "repeat code". In this way, not only the (n−m) bit precision but also the n-bit precision can be improved.

As described above, by increasing the settling time for the first step of the step voltage, the voltage value of the output voltage is allowed to reach the voltage value for the first step within the settling time for the first step. With this, the settling error can be reduced and thus occurrence of "repeat code" is prevented. In this way, with the function as the DAC being kept from failing, this embodiment is sufficiently applicable to an application for which no ultra-high precision linearity is required.

Also, by making the voltage values for the second and subsequent steps higher than the respective target voltage values, the rise rate of the voltage value of the output voltage can be increased. Hence, the voltage value of the output voltage is allowed to reach the target voltage values within the respective settling times, and thus the linearity between the digital value and the voltage value of the output voltage can further be improved.

Moreover, since no sample/hold circuit is connected upstream of the buffer 106 and the size of the switch 107 can be increased, the relative precision of the signal path from the buffer 106 to the load capacitance 21 can be improved, and this can reduce variations in the time constant of the output voltage among the plurality of DAC circuits 110. Hence, the time constant of the output voltage can be considered same among the plurality of DAC circuits 110, and this makes it easy to set the emphasis amount for the respective DAC circuits.

Note that in the settling time for the first step, the settling error should preferably be converged to within ½ LSB (less significant bit) in n-bit precision. In other words, the settling error should preferably be converged to within a potential difference equivalent to a half of one level of gradation in n-bit precision.

The length of the settling time for the first step of the step voltage may be set, considering the time constant of the output voltage, so that the voltage value of the output voltage can reach (or be close to) the voltage value for the first step within the settling time for the first step.

The emphasis amount a added for the second and subsequent steps of the step voltage is not limited to the voltage value corresponding to one level of gradation in n-bit precision. The emphasis amount a may be set, considering the time constant of the output voltage and the settling time for each step of the step voltage, so that the voltage value of the output voltage can reach (or be close to) the target voltage value within the settling time for each of the second and subsequent steps.

To each of the $2^{n-m}$ synthesis sections of the step voltage generation circuit 103, ($2^m-1$) reference voltages are supplied as the ($2^m-1$) voltages for the second and subsequent steps of a step voltage. Alternatively, as the ($2^m-1$) voltages, not the reference voltages generated by the reference voltage generation circuit 101 but voltages generated by another voltage generation circuit may be used.

Embodiment 3

Figure 8:
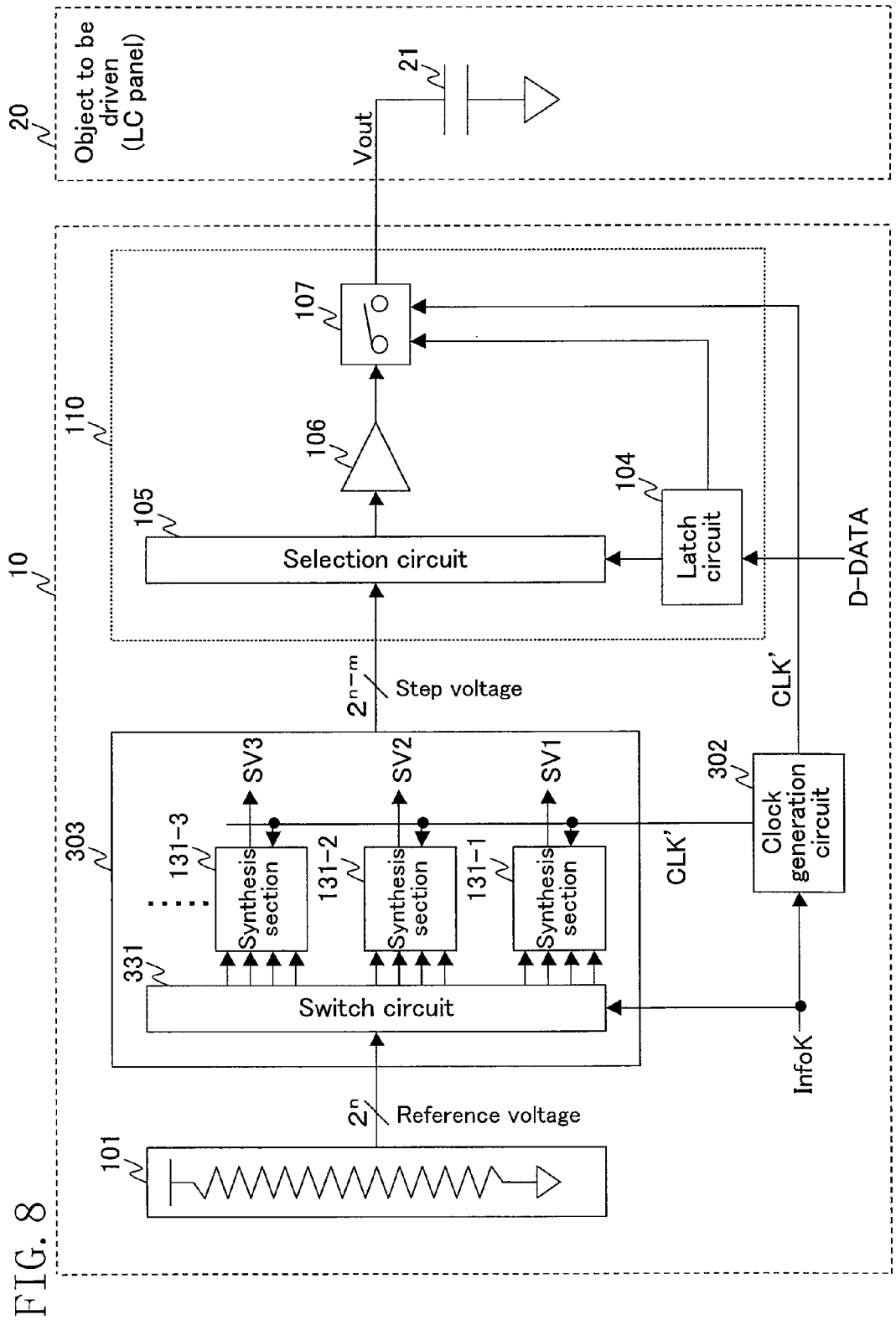
FIG. 8 is a block diagram of a drive device of Embodiment 3 of the present invention.

FIG. 8 shows a configuration of a drive device of Embodiment 3 of the present invention. The drive device 10 of this embodiment is the same in configuration as that of FIG. 1 except for including a clock generation circuit 302 and a step voltage generation circuit 303 in place of the clock generation circuit 102 and the step voltage generation circuit 103 shown in FIG. 1.

The clock generation circuit (settling time adjustment section) 302 adjusts the length of the time period equivalent to the settling time for the first step of a step voltage in the clock signal CLK' according to time constant information InfoK. The time constant information InfoK is information on the time constant of the output voltage (time constant in the signal path from the reference voltage generation circuit 101 to the load capacitance 21), which is the row number of a gate line selected by the gate driver 30, for example.

The step voltage generation circuit 303 adjusts the emphasis amount a to be added to the second and subsequent steps of the step voltage according to the time constant information InfoK. More specifically, the step voltage generation circuit 303 includes a switch circuit (emphasis adjustment section) 331 in addition to the components of the step voltage generation circuit 103 shown in FIG. 1. The switch circuit 331 supplies $2^m$ reference voltages to each of the $2^{n-m}$ synthesis sections. In other words, the switch circuit 331 supplies, to each of the $2^{n-m}$ synthesis sections, a voltage indicating the target voltage value corresponding to the first step of a step voltage (i.e., the reference voltage) and also ($2^m-1$) voltages corresponding to the ($2^m-1$) steps other than the first step. The voltage value of each of the ($2^m-1$) voltages is equivalent to a voltage value obtained by adding the emphasis amount α to the corresponding target voltage value. The switch circuit 331 also updates the voltage values of the ($2^m-1$) voltages supplied to each of the $2^{n-m}$ synthesis sections according to the time constant information InfoK. In other words, the switch circuit 331 adjusts the emphasis amount a according to the time constant information InfoK.

Next, the relationship between the magnitude of the time constant and the length of the settling time for the first step of a step voltage, as well as the relationship between the magnitude of the time constant and the emphasis amount for each step of the step voltage, will be described. Note herein that in FIG. 3 the gate lines G1, G2, G3, . . . have sequential row numbers assigned in ascending order starting from the one closest to the drive device 10.

As shown in FIG. 3, a plurality of liquid crystal capacitances (load capacitances) 21 are connected to each of the source lines S1, S2, S3, . . . . The source line for connecting a liquid crystal capacitance 21 with the corresponding DAC circuit 110 is longer as the liquid crystal capacitance 21 is more distant from the DAC circuit 110, and thus the time constant of the output voltage supplied to this liquid crystal capacitance is greater. In other words, as the row number of the gate line selected by the gate driver 30 is greater, the time constant of the output voltage is greater.

In the clock generation circuit 302, the settling time for the first step of a step voltage is determined in advance for each row number. For example, as the row number is greater, the settling time for the first step for the row number is longer.

In the step voltage generation circuit 303, the emphasis amount is determined in advance for each row number. For example, as the row number is greater, the emphasis amount for the row number is greater.

The operation of the drive device of FIG. 8 will be described with reference to FIGS. 9A and 9B. Note that the description will be made taking the case of output of the step voltage SV2 as an example.

Figure 9A:
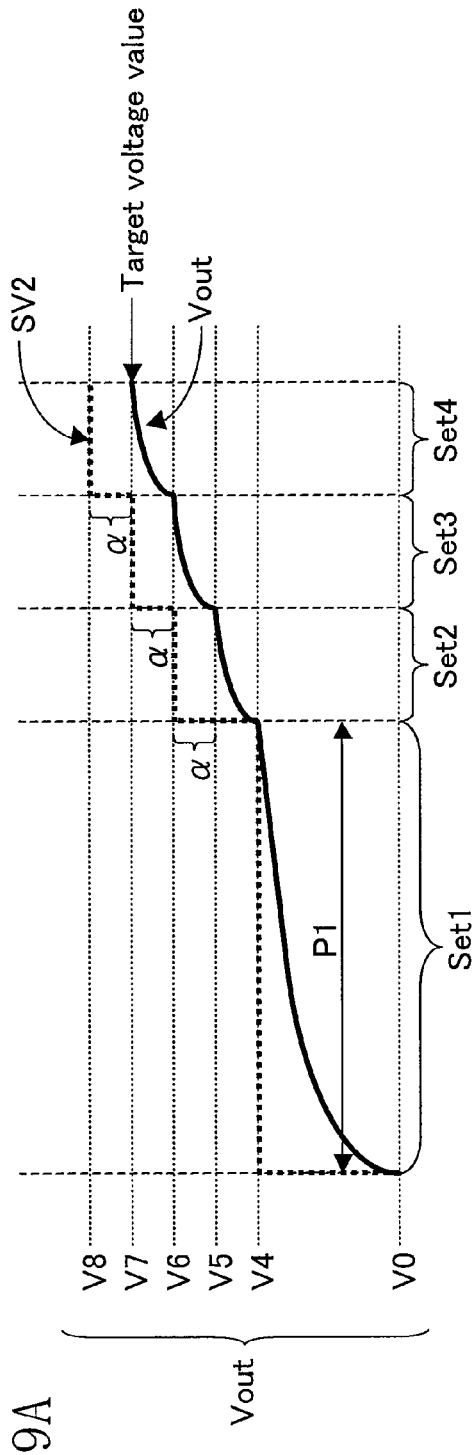
FIGS. 9A and 9B are waveform diagrams for explaining the operation of the drive device of FIG. 8.
Figure 9B:
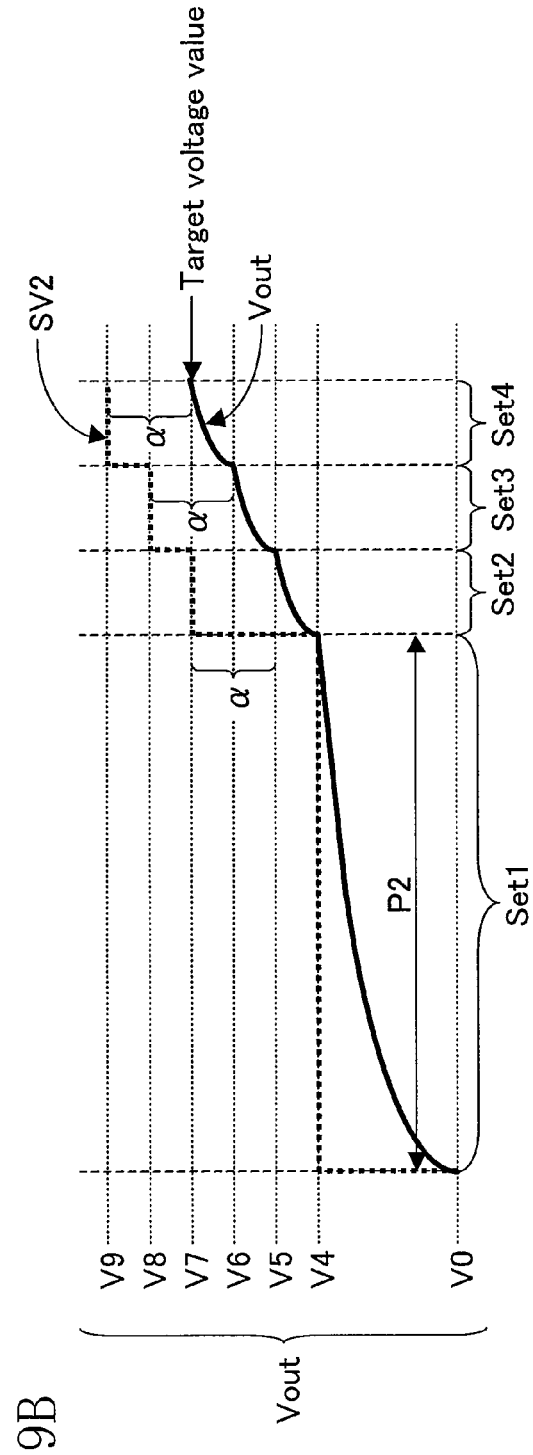

First, as in FIG. 9A, assume that the length of the settling time for the first step of the step voltage SV2 is "P1", and the emphasis amount a for each of the second and subsequent steps of the step voltage SV2 is the "voltage value of one level of gradation". In this case, the switch circuit 331 supplies the reference voltage V4 corresponding to the first step of the step voltage SV2 and the reference voltages V6, V7 and V8 corresponding to the subsequent three steps of the step voltage SV2 (reference voltages higher in voltage value than the reference voltages V5, V6 and V7 as their target voltage values by one level of gradation). At this time, assume also that the gate driver 30 is selecting the gate G2, that is, the row number indicated as the time constant information InfoK is "2".

In the state described above, once the gate driver 30 selects the gate line G3, the row number indicated as the time constant information InfoK becomes "3". At this time, the clock generation circuit 302 changes the length of the time period equivalent to the settling time Set1 for the first step of the step voltage in the clock signal CLK from "P1" to "P2" that is longer than P1. Also, the step voltage generation circuit 303 changes the emphasis amount a from the "voltage value of one level of gradation" to the "voltage value of two levels of gradation". In other words, the switch circuit 331 supplies the reference voltages V7, V8 and V9 (reference voltages higher in voltage value than their reference voltages V5, V6 and V7 by two levels of gradation), in place of the reference voltages V6, V7 and V8, to the synthesis section 131-2. In this way, as shown in FIG. 9B, the settling time Sell for the first step of the step voltage SV2 is made long, and the voltage values for the second and subsequent steps of the step voltages SV2 are made high. Hence, even when the distance to the load capacitance 21 becomes long increasing the time constant of the output voltage, increase in settling error can be suppressed because the settling time for the first step of the step voltage and the emphasis amount a for the second and subsequent steps of the step voltage are made large.

As described above, by adjusting the settling time for the first step according to the change in the magnitude of the time constant of the output voltage, increase in settling error in the first step of a step voltage can be suppressed, and thus the monotonous increase characteristic of the output voltage can be ensured with reliability.

Also, by adjusting the emphasis amount added to each of the second and subsequent steps of the step voltage according to the change in the magnitude of the time constant of the output voltage, the improvement of the bit precision can be maintained.

Note that if only the time constant of the output voltage is previously known for each row number, it is possible to associate in advance the settling time for the first step of a step voltage and the emphasis amount a to be added to each of the second and subsequent steps of the step voltage with the time constant information.

Embodiment 4

The drive device of Embodiment 4 of the present invention has substantially the same configuration as that of FIG. 1 but is different therefrom in the processing by the step voltage generation circuit 103.

In each of the $2^{n-m}$ step voltages generated by the step voltage generation circuit 103, the first-step voltage value is equivalent to a voltage value obtained by adding an emphasis amount β to the target voltage value corresponding to the digital value allocated to the first step, and the second and subsequent-step voltage values are equivalent to voltage values obtained by adding an emphasis amount α to the target voltage values corresponding to the digital values allocated to these steps.

Figure 10:
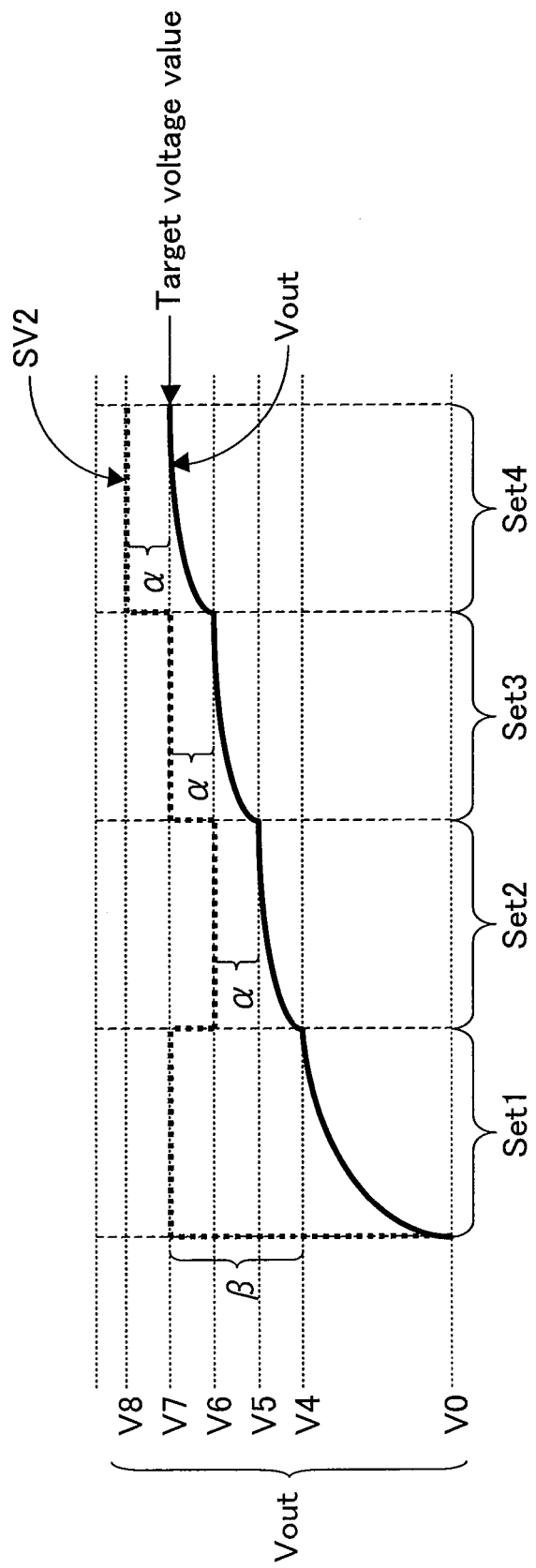
FIG. 10 is a waveform diagram for explaining a step voltage in a drive device of Embodiment 4 of the present invention.

Referring to FIG. 10, the step voltage in this embodiment will be described. In this embodiment, each of the $2^{n-m}$ synthesis sections of the step voltage generation circuit 103 receives a voltage corresponding to the first step of the step voltage (a voltage having a voltage value obtained by adding the emphasis amount β to the target voltage value) and ($2^m-1$) voltages corresponding to the ($2^m-1$) steps other than the first step (voltages having voltage values obtained by adding the emphasis amount a to the respective target voltage values).

Assuming that n=10 and m=2, four digital values each having a value of the eight most significant bits of "00000001" are allocated to the step voltage SV2. If "emphasis amount β"="voltage value of three levels of gradation" and "emphasis amount α"="voltage value of one level of gradation", the voltage values for the respective steps of the step voltage SV2 are expressed as follows:

First step: Reference voltage V7 (target voltage value (V4) corresponding to digital value "0000000100"+emphasis amount β)

Second step: Reference voltage V6 (target voltage value (V5) corresponding to digital value "0000000101"+emphasis amount α)

Third step: Reference voltage V7 (target voltage value (V6) corresponding to digital value "0000000110"+emphasis amount α)

Fourth step: Reference voltage V8 (target voltage value (V7) corresponding to digital value "0000000111"+emphasis amount α)

The control of the settling time for each step of the step voltage and the output time period of the step voltage is executed in substantially the same manner as that in Embodiment 1.

Next, with reference to FIG. 10, the operation of the drive device of this embodiment will be described. Note that the description will be made taking the case of output of the step voltage SV2 as an example.

As shown in FIG. 10, the voltage value for the first step of the step voltage SV2 is higher than the target voltage value. Hence, the rise rate of the voltage value of the output voltage Vout in the settling time Set1 can be increased, allowing the output voltage Vout to reach the target voltage value for the first step of the step voltage within the settling time Set1. Hence, the settling error in the first step of the step voltage can be reduced. Moreover, as in the case of FIG. 6B, the voltage values for the second and subsequent steps of the step voltage are higher than the respective target voltage values. Hence, the settling error in the respective steps of the step voltage can be reduced.

As described above, by making the voltage value for the first step of a step voltage higher than the target voltage value, the voltage value of the output voltage is allowed to reach the target voltage value for the first stage within the settling time for the first step. With this, the settling error can be reduced and thus occurrence of "repeat code" is prevented.

Figure 11:
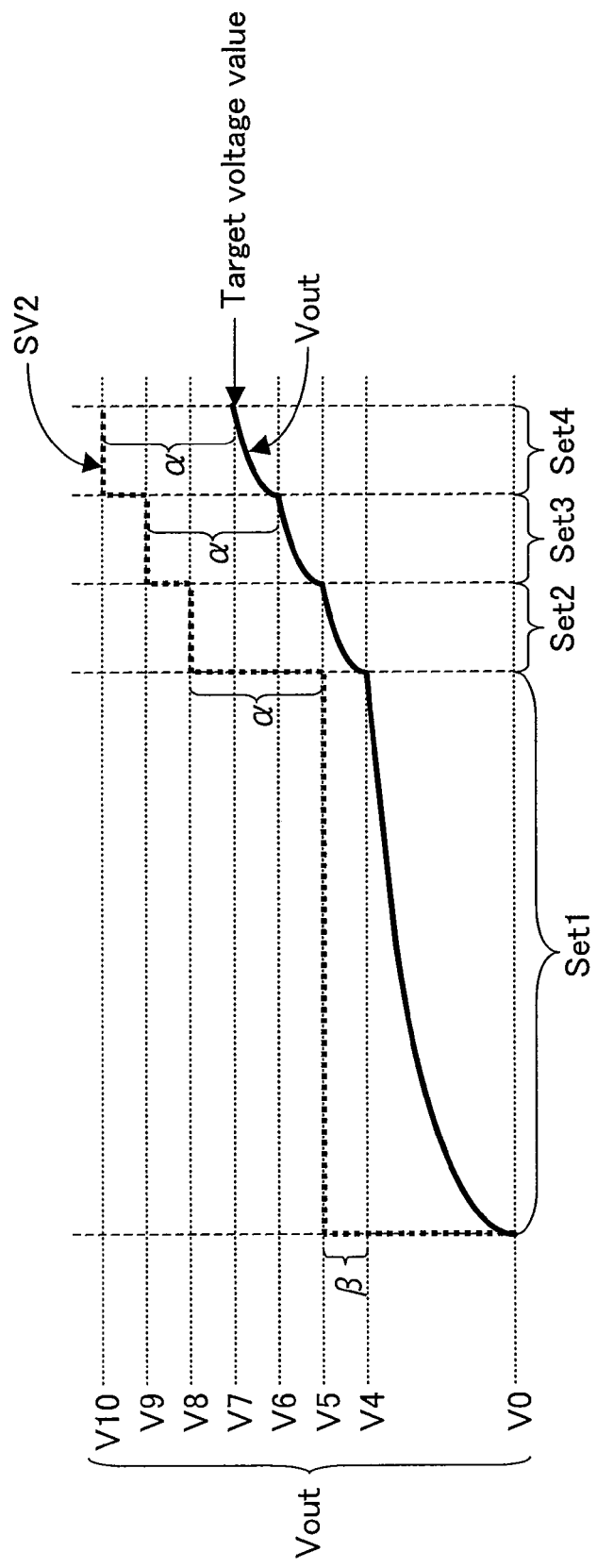
FIG. 11 is a waveform diagram for explaining a step voltage in an alteration of the drive device of Embodiment 4 of the present invention.

As in the drive device of Embodiment 2, the clock generation circuit may be configured to generate the clock signal CLK' in which the time period equivalent to the settling time for the first step of a step voltage is longer than each of the ($2^m-1$) time periods equivalent to the settling times for the ($2^m-1$) steps of the step voltage. In this case, the step voltage and the output voltage will be as shown in FIG. 11. Having this configuration, the settling error can further be suppressed compared with the case of the drive device of Embodiment 2. That is, even when extension of the settling time for the first step of the step voltage is restricted, the settling error in the first step can be suppressed by adjusting the emphasis amount β added to the first step of the step voltage.

Also, as in the drive device of FIG. 8, the emphasis amount β added to the first step of the step voltage may be adjusted according to time constant information.

Embodiment 5

Figure 12:
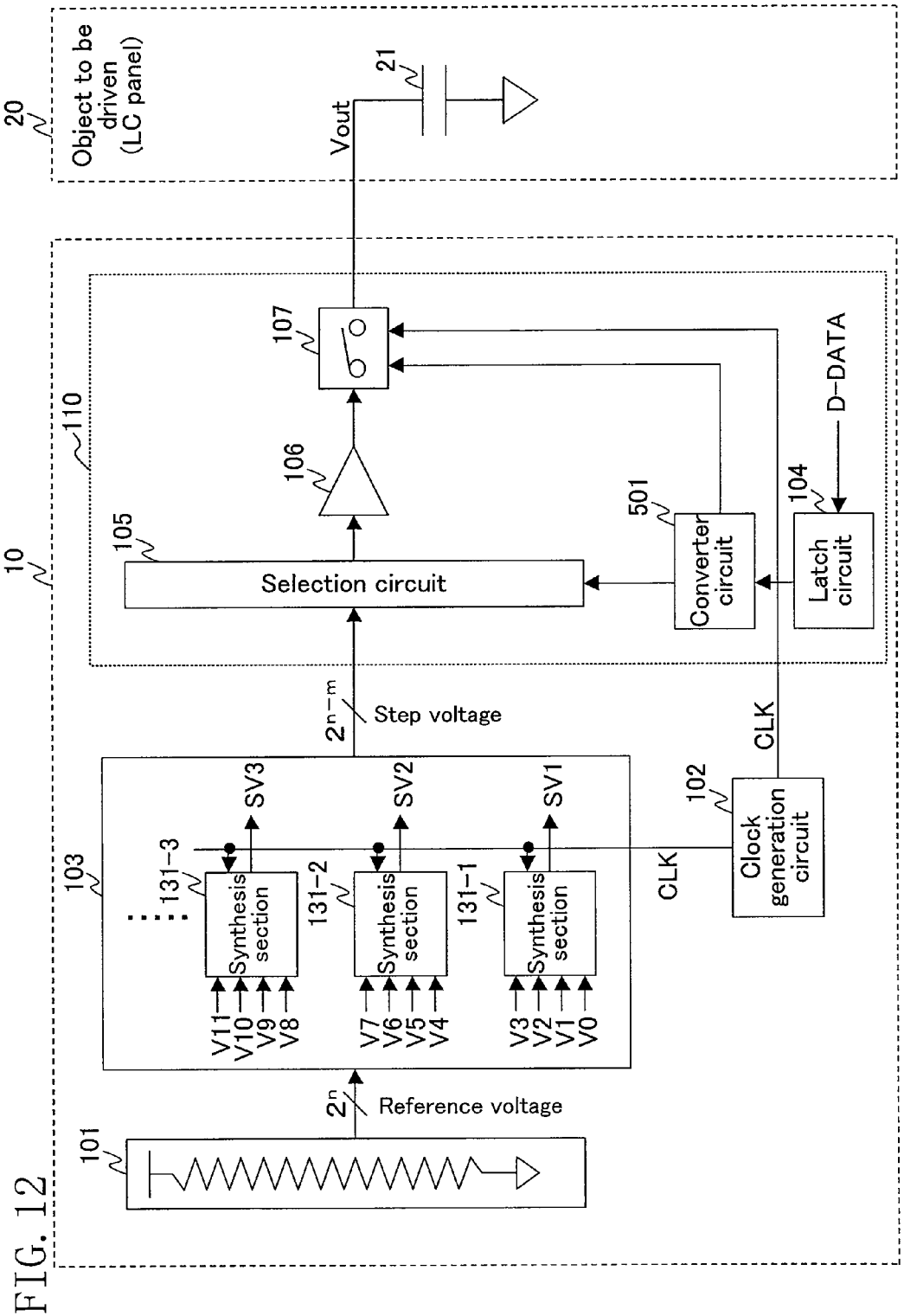
FIG. 12 is a block diagram of a drive device of Embodiment 5 of the present invention.

FIG. 12 shows a configuration of a drive device of Embodiment 5 of the present invention. The drive device 10 of this embodiment further includes a converter circuit 501 in addition to the components of the drive device 10 of FIG. 1. In the drive device 10 of this embodiment, the voltage value of the output voltage corresponding to each digital value is previously known, and the digital value of digital data is corrected so that the linear relationship is maintained between the digital value and the output voltage.

The converter circuit 501 corrects the digital value of received digital data based on a lookup table prepared in advance, and outputs the digital value of the (n−m) most significant bits of the corrected digital data to the clock generation circuit 102 and the digital value of the m least significant bits of the corrected digital data to the switch 107.

The lookup table will be described with reference to FIGS. 13A, 13B and 13C. Note that in FIGS. 13A, 13B and 13C, the digital values and the corrected digital values are expressed in decimal notation for simplification of description.

As in FIG. 13A, the relationship between the digital value and the voltage value of the actual output voltage fails to exhibit monotonous increase in some portions (digital values "8", "12", "16" and "20" in FIG. 13A) in some cases. In view of this, as in FIG. 13B, the voltage values of the actual output voltage are sorted in ascending order, and the digital values corresponding to the sorted voltage values of the output voltage are given as corrected digital values. As in FIG. 13C, the corrected digital values and digital values arranged in ascending order from the minimum value are put in one-to-one correspondence. In this way, a lookup table is prepared in which the "digital values" are associated with the "corrected digital values having linear relationship with the voltage values of the actual output voltage".

Figure 14:
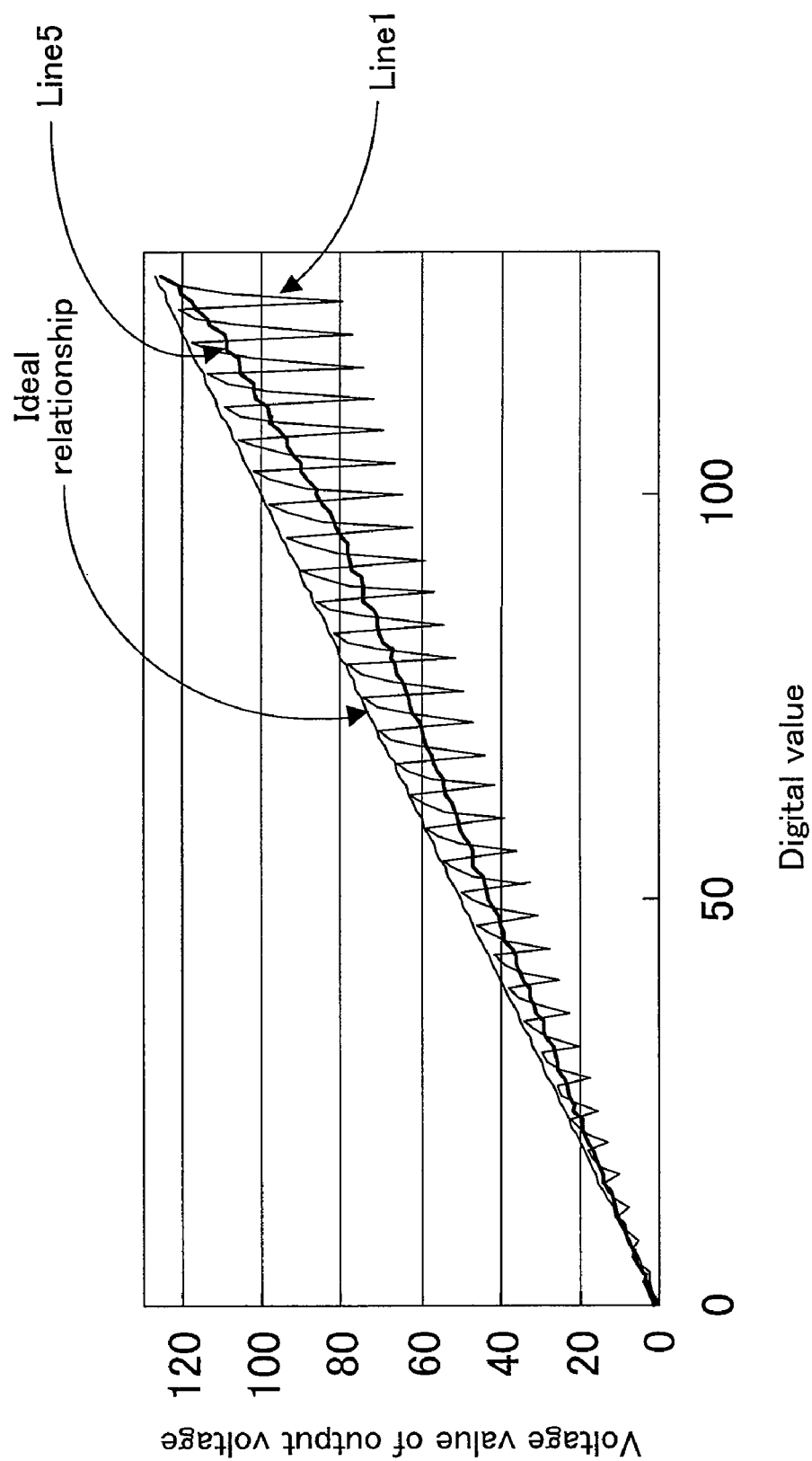
FIG. 14 is a graph for explaining the relationship between the digital value and the output value of the output voltage in the drive device of FIG. 12.

Referring to FIG. 14, the relationship between the digital value and the output voltage will be described. When no correction is made for the digital value, "repeat code" may occur, resulting in exhibiting a relationship between the digital value and the voltage value of the output voltage like line Line1. In reverse, when the correction is made, the relationship between the digital value and the voltage value of the output voltage is like line Line5, in which the monotonous increase characteristic of the voltage value of the output voltage can be secured and thus occurrence of "repeat code" can be prevented.

As described above, with the linear relationship between the digital value and the voltage value of the output voltage, the settling error can be reduced, and thus the monotonous increase characteristic of the output voltage can be secured.

Other Embodiments

In Embodiments 2 to 5 described above, in place of the switch 107 connected downstream of the buffer 106, a sample/hold circuit composed of the switch 107 and a sample capacitor 111 may be provided between the selection circuit 105 and the buffer 106. FIGS. 15 to 18 respectively show alterations of Embodiments 2 to 5 having such a configuration.

Figure 15:
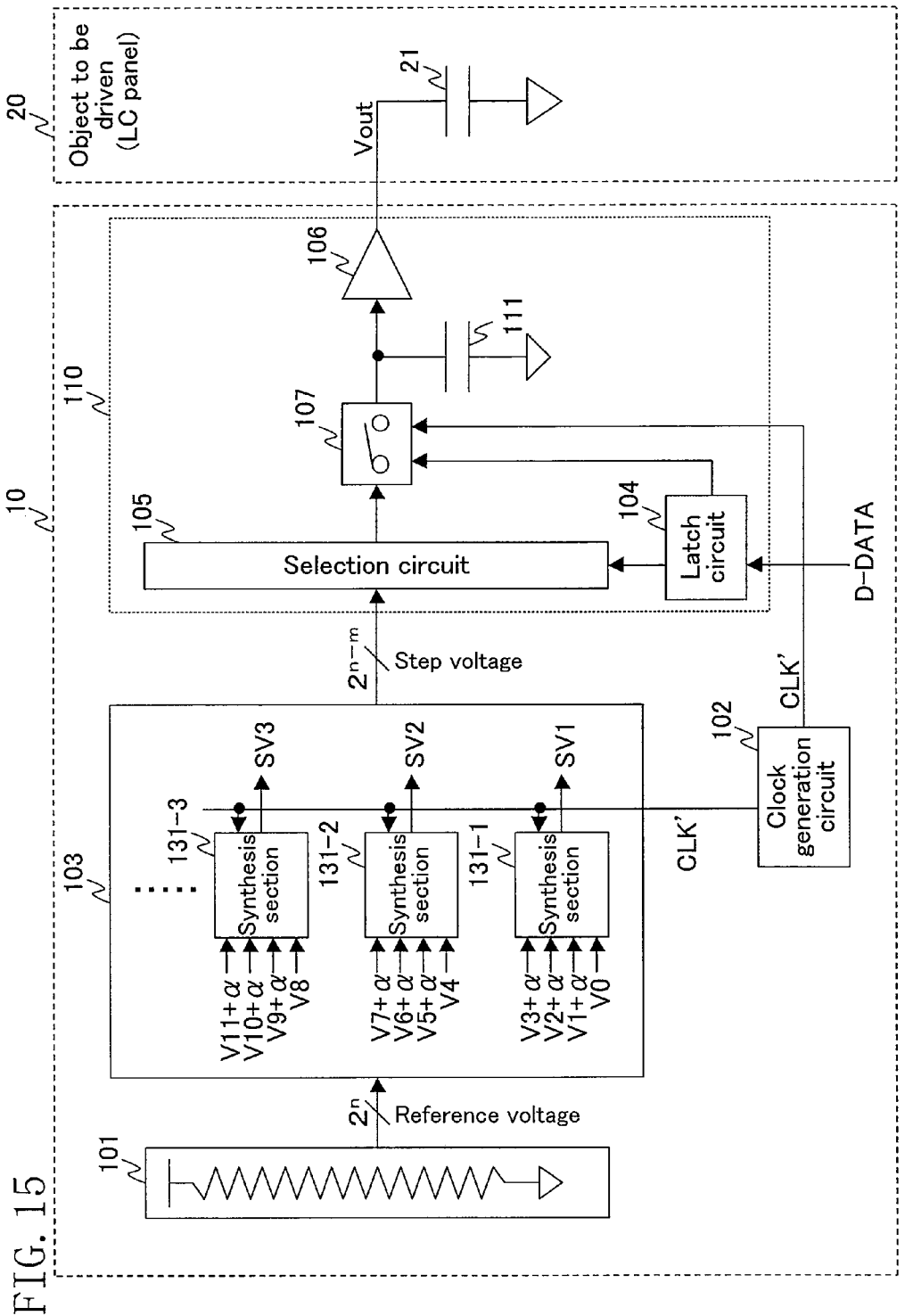
FIG. 15 is a block diagram for explaining an alteration of Embodiment 2.

FIG. 15 shows an alteration of the drive device of Embodiment 2. In the drive device of FIG. 15, also, the effect of securing the monotonous increase characteristic of the output voltage can be obtained by increasing the settling time for the first step of each step voltage. Moreover, the effect of improving the linearity between the digital value and the voltage value of the output voltage can be obtained by increasing the voltage values for the second and subsequent steps of the step voltage.

Figure 16:
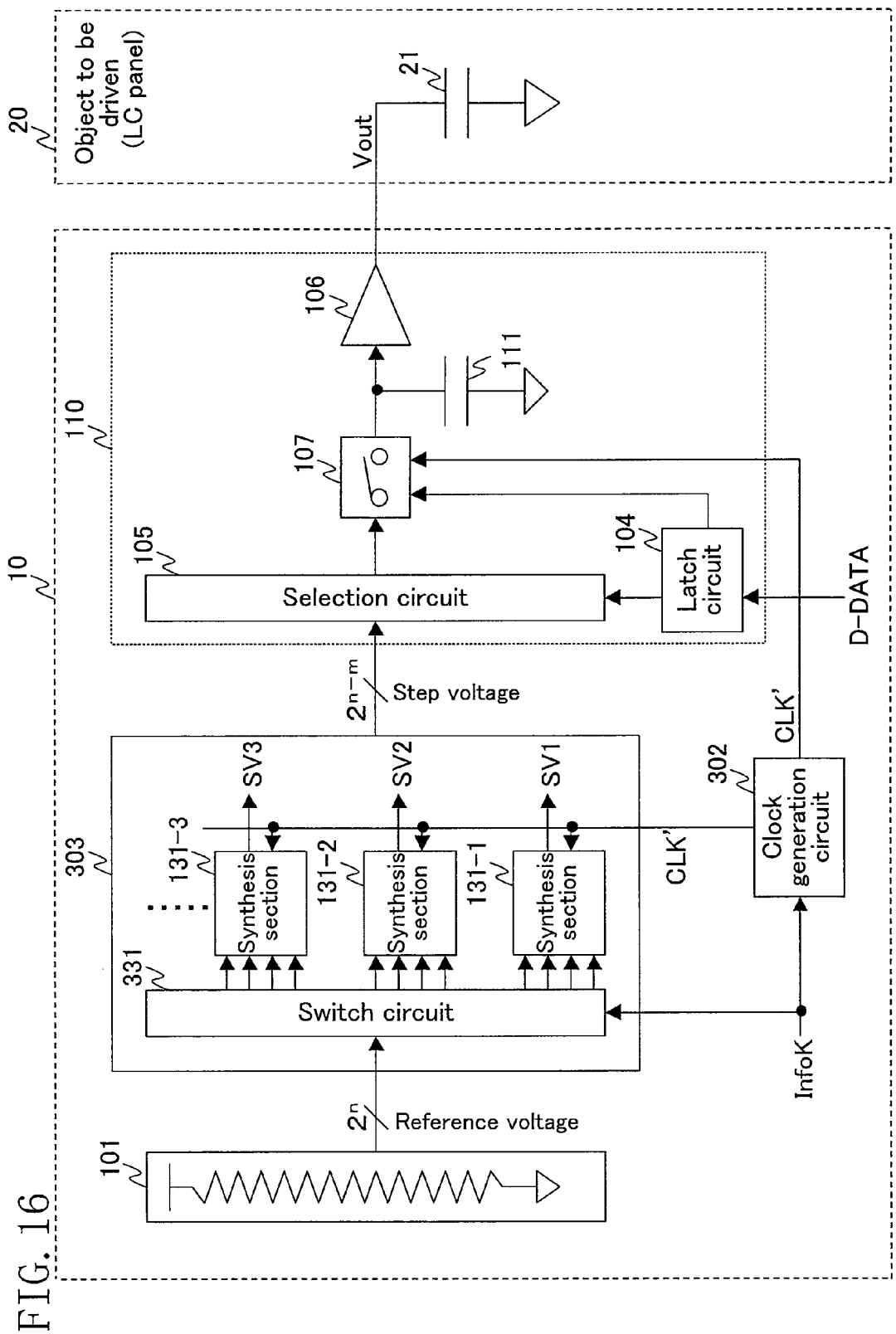
FIG. 16 is a block diagram for explaining an alteration of Embodiment 3.

FIG. 16 shows an alteration of the drive device of Embodiment 3. In the drive device of FIG. 16, also, the effect of suppressing the increase in settling error can be obtained by adjusting the settling time for the first step of each step voltage according to the change in the magnitude of the time constant of the output voltage. Moreover, the effect of maintaining the linearity between the digital value and the voltage value of the output voltage can be obtained by adjusting the emphasis amount for each step of the step voltage according to the change in the magnitude of the time constant of the output voltage.

Figure 17:
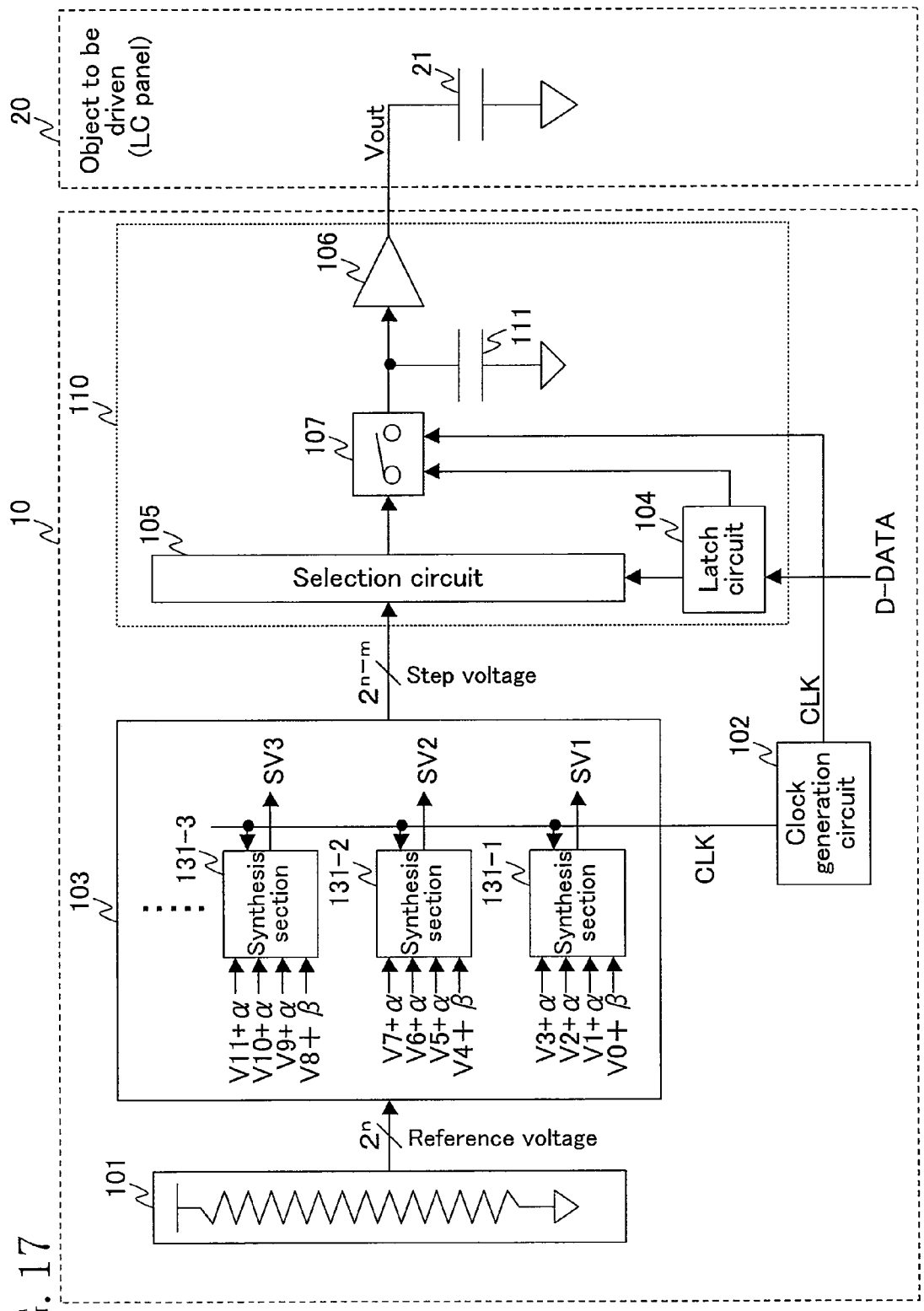
FIG. 17 is a block diagram for explaining an alteration of Embodiment 4.

FIG. 17 shows an alteration of the drive device of Embodiment 4. In the drive device of FIG. 17, also, the effect of reducing the settling error can be obtained by making the voltage value for the first step of each step voltage higher than the target voltage value. It is also possible to adjust the emphasis amounts α and β individually according to the change in the magnitude of the time constant of the output voltage if only the step voltage generation circuit 103 is configured like the step voltage generation circuit 303 shown in FIG. 16.

Figure 18:
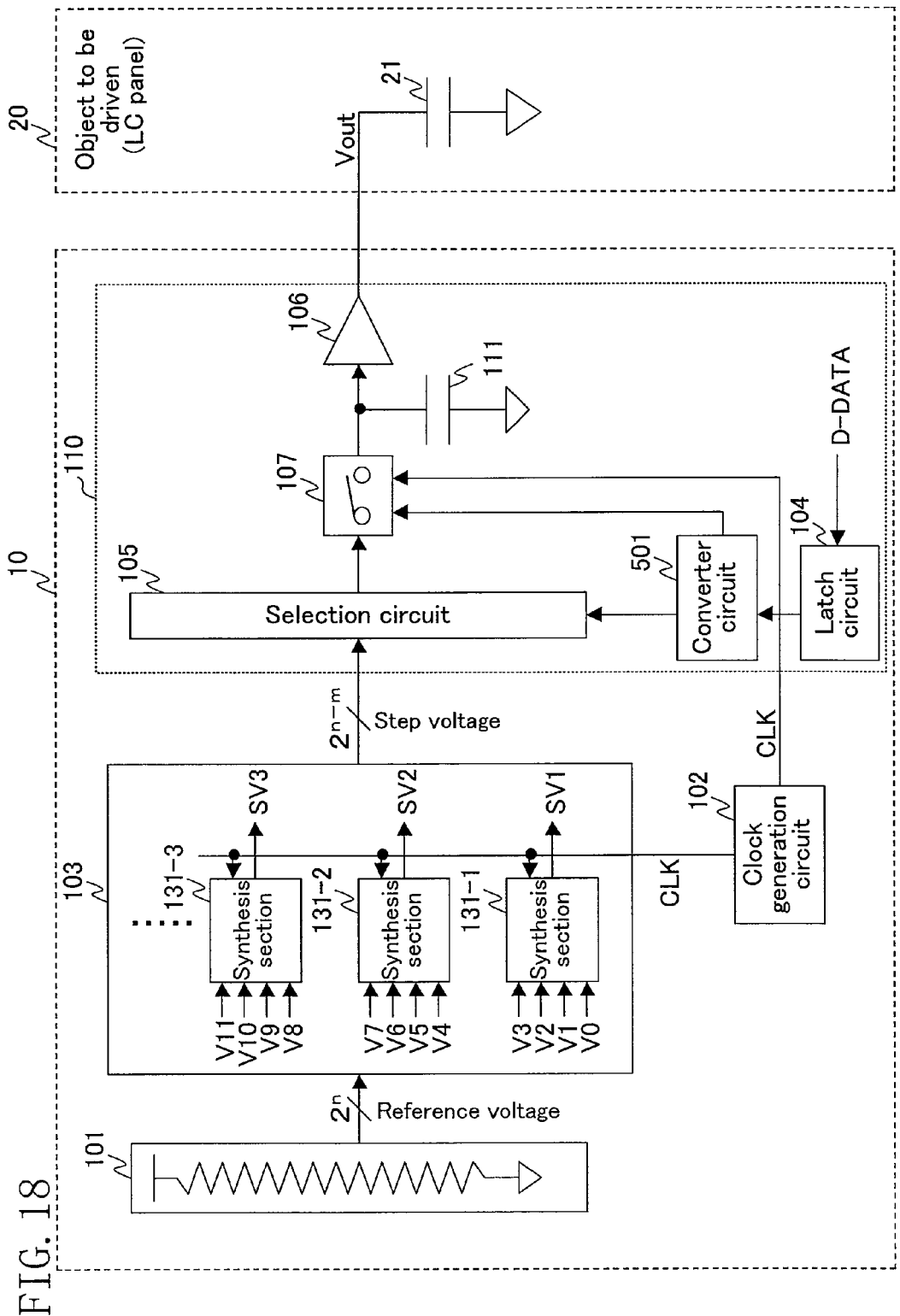
FIG. 18 is a block diagram for explaining an alteration of Embodiment 5.

FIG. 18 shows an alteration of the drive device of Embodiment 5. In the drive device of FIG. 18, also, the effect of securing the monotonous increase characteristic of the output voltage can be obtained by correcting the digital value so that the relationship between the digital value and the voltage value of the output voltage is linear.

Industrial Applicability

As described above, the present invention is useful as a digital/analog converter circuit used for a drive device for driving a load capacitance of a liquid crystal panel and the like.

The invention claimed is:

1. A digital/analog converter circuit for generating an output voltage having a voltage value corresponding to a digital value of n bits of digital data where n is a natural number and supplying the output voltage to a load capacitance as an object to be driven, the digital/analog converter circuit comprising:
a step voltage generation section for generating a plurality of step voltages corresponding to different digital values of (n−m) bits of digital data where m is a natural number and smaller than n, each of the plurality of step voltages having a voltage value changing stepwise;
a selection section for selecting a step voltage, among the plurality of step voltages generated by the step voltage generation section corresponding to the digital value of (n−m) most significant bits of the digital data;
an amplifier section for amplifying the step voltage selected by the selection section; and
an output section for supplying the step voltage amplified by the amplifier section as the output voltage for a time period corresponding to the digital value of m least significant bits of the digital data,
wherein for each of the plurality of step voltages, different digital values of m bits are allocated to different steps of the step voltage.

2. The digital/analog converter circuit of claim 1, wherein for each of the plurality of step voltages, a settling time for the first step of the step voltage is longer than a settling time for each of the second, subsequent and last steps of the step voltage.

3. A digital/analog converter circuit for generating an output voltage having a voltage value corresponding to a digital value of digital data and supplying the output voltage to a load capacitance as an object to be driven, the digital/analog converter circuit comprising:
- a selection section for selecting a step voltage, among a plurality of step voltages each having a voltage value changing stepwise, corresponding to the digital value of the digital data;
- an amplifier section for amplifying the step voltage selected by the selection section; and
- an output section for supplying the step voltage amplified by the amplifier section as the output voltage for a time period corresponding to the digital value of the digital data, wherein:
- for each of the plurality of step voltages, different digital values are allocated to different steps of the step voltage,
- for each of the plurality of step voltages, a settling time for the first step of the step voltage is longer than a settling time for each of the second and subsequent steps of the step voltage, and
- for each of the plurality of step voltages, a voltage value for the first step of the step voltage is higher than a target voltage value corresponding to a digital value allocated to the first step.

4. The digital/analog converter circuit of claim 3, wherein for each of the plurality of step voltages, voltage values for the second and subsequent steps of the step voltage are higher than target voltage values corresponding to digital values allocated to these steps.

5. The digital/analog converter circuit of claim 4, further comprising an emphasis adjustment section for adjusting, for each of the plurality of the step voltages, the voltage values for the second and subsequent steps of the step voltage according to the magnitude of a time constant of the output voltage.

6. The digital/analog converter circuit of claim 3, further comprising an emphasis adjustment section for adjusting, for each of the plurality of the step voltages, the voltage value for the first step of the step voltage according to the magnitude of a time constant of the output voltage.

7. A digital/analog converter circuit for generating an output voltage having a voltage value corresponding to a digital value of digital data and supplying the output voltage to a load capacitance as an object to be driven, the digital/analog converter circuit comprising:
- a selection section for selecting a step voltage, among a plurality of step voltages each having a voltage value changing stepwise, corresponding to the digital value of the digital data;
- an amplifier section for amplifying the step voltage selected by the selection section; and
- an output section for supplying the step voltage amplified by the amplifier section as the output voltage for a time period corresponding to the digital value of the digital data, wherein:
- for each of the plurality of step voltages, different digital values are allocated to different steps of the step voltage,
- for each of the plurality of step voltages, a settling time for the first step of the step voltage is longer than a settling time for each of the second and subsequent steps of the step voltage, and
- for each of the plurality of step voltages, voltage values for the second and subsequent steps of the step voltage are higher than target voltage values corresponding to digital values allocated to these steps.

8. The digital/analog converter circuit of claim 7, further comprising an emphasis adjustment section for adjusting, for each of the plurality of the step voltages, the voltage values for the second and subsequent steps of the step voltage according to the magnitude of a time constant of the output voltage.

9. A digital/analog converter circuit for generating an output voltage having a voltage value corresponding to a digital value of digital data and supplying the output voltage to a load capacitance as an object to be driven, the digital/analog converter circuit comprising:
- a selection section for selecting a step voltage, among a plurality of step voltages each having a voltage value changing stepwise, corresponding to the digital value of the digital data;
- an amplifier section for amplifying the step voltage selected by the selection section;
- an output section for supplying the step voltage amplified by the amplifier section as the output voltage for a time period corresponding to the digital value of the digital data; and
- a setting time adjustment section, wherein:
- for each of the plurality of step voltages, different digital values are allocated to different steps of the step voltage,
- for each of the plurality of step voltages, a settling time for the first step of the step voltage is longer than a settling time for each of the second and subsequent steps of the step voltage, and
- the settling time adjustment section adjusts, for each of the plurality of the step voltages, the settling time for the first step of the step voltage according to the magnitude of a time constant of the output voltage.

10. A digital/analog converter circuit for generating an output voltage having a voltage value corresponding to a digital value of digital data and supplying the output voltage to a load capacitance as an object to be driven, the digital/analog converter circuit comprising:
- a selection section for selecting a step voltage, among a plurality of step voltages each having a voltage value changing stepwise, corresponding to the digital value of the digital data;
- an amplifier section for amplifying the step voltage selected by the selection section; and
- an output section for supplying the step voltage amplified by the amplifier section as the output voltage for a time period corresponding to the digital value of the digital data, wherein:
- for each of the plurality of step voltages, different digital values are allocated to different steps of the step voltage, and
- for each of the plurality of step voltages, a voltage value for the first step of the step voltage is higher than a target voltage value corresponding to a digital value allocated to the first step.

11. The digital/analog converter circuit of claim 10, wherein for each of the plurality of step voltages, voltage values for the second and subsequent steps of the step voltage are higher than target voltage values corresponding to digital values allocated to these steps.

12. The digital/analog converter circuit of claim 11, further comprising an emphasis adjustment section for adjusting, for each of the plurality of the step voltages, the voltage values for the second and subsequent steps of the step voltage according to the magnitude of a time constant of the output voltage.

13. The digital/analog converter circuit of claim 10, further comprising an emphasis adjustment section for adjusting, for each of the plurality of the step voltages, the voltage value for the first step of the step voltage according to the magnitude of a time constant of the output voltage.

14. The digital/analog converter circuit of claim 1, further comprising a conversion section for converting the digital value of the digital data to a corrected digital value whose correspondence with the voltage value of an actual output voltage is linear,
 wherein the selection section selects a step voltage, among the plurality of step voltages, corresponding to the corrected digital value of the digital data obtained by the conversion section, and
 the output section outputs the step voltage from the amplifier section as the output voltage for a time period corresponding to the corrected digital value of the digital data obtained by the conversion section.

15. A digital/analog converter circuit for outputting an output voltage having a voltage value corresponding to a digital value of n bits of digital data where n is a natural number, the digital/analog converter circuit comprising:
 a selection section for selecting a step voltage, among a plurality of step voltages each having a voltage value changing stepwise, corresponding to the digital value of the digital data; and
 an output section for outputting the step voltage selected by the selection section for a time period corresponding to the digital value of m least significant bits of the digital data where m is a natural number and smaller than n,
 wherein for each of the plurality of step voltages, different digital values are allocated to different steps of the step voltage, and a settling time for the first step of the step voltage is longer than a settling time for each of the second, subsequent and last steps of the step voltage.

16. A digital/analog converter circuit for outputting an output voltage having a voltage value corresponding to a digital value of digital data, comprising:
 a selection section for selecting a step voltage, among a plurality of step voltages each having a voltage value changing stepwise, corresponding to the digital value of the digital data; and
 an output section for outputting the step voltage selected by the selection section for a time period corresponding to the digital value of the digital data, wherein:
 for each of the plurality of step voltages, different digital values are allocated to different steps of the step voltage, and a settling time for the first step of the step voltage is longer than a settling time for each of the second and subsequent steps of the step voltage, and
 for each of the plurality of step voltages, voltage values for the second and subsequent steps of the step voltage are higher than target voltage values corresponding to digital values allocated to these steps.

17. The digital/analog converter circuit of claim 16, further comprising an emphasis adjustment section for adjusting, for each of the plurality of step voltages, the voltage values for the second and subsequent steps of the step voltage according to the magnitude of a time constant of the output voltage.

18. A digital/analog converter circuit for outputting an output voltage having a voltage value corresponding to a digital value of digital data, comprising:
 a selection section for selecting a step voltage, among a plurality of step voltages each having a voltage value changing stepwise, corresponding to the digital value of the digital data;
 an output section for outputting the step voltage selected by the selection section for a time period corresponding to the digital value of the digital data; and
 a setting time adjustment section, wherein:
 each of the plurality of step voltages, different digital values are allocated to different steps of the step voltage, and a settling time for the first step of the step voltage is longer than a settling time for each of the second and subsequent steps of the step voltage, and
 the settling time adjustment section adjusts, for each of the plurality of step voltages, the settling time for the first step of the step voltage according to the magnitude of a time constant of the output voltage.

19. A digital/analog converter circuit for outputting an output voltage having a voltage value corresponding to a digital value of digital data, comprising:
 a selection section for selecting a step voltage, among a plurality of step voltages each having a voltage value changing stepwise, corresponding to the digital value of the digital data; and
 an output section for outputting the step voltage selected by the selection section for a time period corresponding to the digital value of the digital data,
 wherein for each of the plurality of step voltages, different digital values are allocated to different steps of the step voltage, and a voltage value for the first step of the step voltage is higher than a target voltage value corresponding to a digital value allocated to the first step.

20. The digital/analog converter circuit of claim 19, wherein for each of the plurality of step voltages, voltage values for the second and subsequent steps of the step voltage are higher than target voltage values corresponding to digital values allocated to these steps.

21. The digital/analog converter circuit of claim 20, further comprising an emphasis adjustment section for adjusting, for each of the plurality of step voltages, the voltage values for the second and subsequent steps of the step voltage according to the magnitude of a time constant of the output voltage.

22. The digital/analog converter circuit of claim 19, further comprising an emphasis adjustment section for adjusting, for each of the plurality of step voltages, the voltage value for the first step of the step voltage according to the magnitude of a time constant of the output voltage.

23. A digital/analog converter circuit for outputting an output voltage having a voltage value corresponding to a digital value of n bits of digital data where n is a natural number, the digital/analog converter circuit comprising:
 a conversion section for converting the digital value of the digital data to a corrected digital value whose correspondence with the voltage value of an actual output voltage is linear;
 a selection section for selecting a step voltage, among a plurality of step voltages, corresponding to the corrected digital value of the digital data obtained by the conversion section; and
 an output section for outputting the step voltage selected by the selection section as the output voltage for a time period corresponding to the corrected digital value of m least significant bits of the digital data obtained by the conversion section, where m is a natural number and smaller than n.

* * * * *